(12) United States Patent
Hong

(10) Patent No.: US 10,653,046 B2
(45) Date of Patent: May 12, 2020

(54) STRUCTURE HAVING CIRCUIT BOARD DISPOSED ON UPPER FACE OF SHIELD CAN DISPOSED ON CIRCUIT BOARD, AND ELECTRONIC DEVICE INCLUDING SAME

(71) Applicant: SAMSUNG ELECTRONICS CO., LTD., Suwon-si, Gyeonggi-do (KR)

(72) Inventor: Eunseok Hong, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/442,703

(22) Filed: Jun. 17, 2019

(65) Prior Publication Data
US 2019/0387649 A1 Dec. 19, 2019

(30) Foreign Application Priority Data
Jun. 19, 2018 (KR) .................. 10-2018-0070068

(51) Int. Cl.
*H05K 9/00* (2006.01)
*H05K 1/18* (2006.01)
(Continued)

(52) U.S. Cl.
CPC .......... *H05K 9/0024* (2013.01); *H01Q 1/243* (2013.01); *H05K 1/144* (2013.01); *H05K 1/181* (2013.01);
(Continued)

(58) Field of Classification Search
None
See application file for complete search history.

(56) References Cited

U.S. PATENT DOCUMENTS

| | | | | |
|---|---|---|---|---|
| 6,304,458 B1 * | 10/2001 | Mendolia | ............. | H04B 15/005 174/385 |
| 7,177,161 B2 * | 2/2007 | Shima | ................... | H04B 15/00 174/350 |
| 7,277,301 B2 * | 10/2007 | Liang | .................. | H05K 9/0028 174/350 |
| 7,365,992 B2 * | 4/2008 | Lee | ....................... | H01L 23/552 174/350 |
| 7,729,131 B2 * | 6/2010 | Wang | ................... | H05K 1/144 174/350 |

(Continued)

FOREIGN PATENT DOCUMENTS

JP 8-148878 6/1996
KR 10-2007-0057278 6/2007

(Continued)

OTHER PUBLICATIONS

International Search Report dated Sep. 23, 2019, issued in International Application No. PCT/KR2019/007136.

(Continued)

*Primary Examiner* — Tuan A Tran
(74) *Attorney, Agent, or Firm* — Nixon & Vanderhye, P.C.

(57) ABSTRACT

An electronic device according to various embodiments may include: a first communication module comprising communication circuitry configured to process a communication signal in a first frequency band among multiple frequency bands corresponding to a specified communication method; a second communication module comprising communication circuitry configured to process a communication signal in a second frequency band among the multiple frequency bands; a first circuit board on which the first communication module and a first connector electrically connected to the first communication module are mounted; a shield can including an upper face including at least one opening and (Continued)

the shield can further including a side face surrounding the upper face of the shield can, the shield can being disposed on the first circuit board to accommodate the first communication module in an inner space defined by the upper face and the side face, the side face being electrically connected to a first ground portion of the first circuit board; a second circuit board on which the second communication module and a second connector electrically connected to the second communication module are mounted, the second circuit board being disposed on the upper face of the shield can such that the second communication module corresponds to the first communication module and/or at least one component mounted on the first circuit board in the inner space through a corresponding opening among the at least one opening wherein the second connector is electrically coupled to the first connector; and an adhesive disposed between the upper face and the second circuit board.

20 Claims, 16 Drawing Sheets

(51) Int. Cl.
*H05K 1/14* (2006.01)
*H01Q 1/24* (2006.01)
*H05K 5/00* (2006.01)

(52) U.S. Cl.
CPC ..... *H05K 5/0017* (2013.01); *H05K 2201/042* (2013.01); *H05K 2201/10098* (2013.01); *H05K 2201/10371* (2013.01)

(56) References Cited

U.S. PATENT DOCUMENTS

| | | | |
|---|---|---|---|
| 7,999,196 B2 * | 8/2011 | Hsieh | H05K 9/0045 174/386 |
| 8,018,731 B2 * | 9/2011 | Sakurai | H01L 23/13 361/728 |
| 8,976,540 B2 * | 3/2015 | Yoo | H05K 9/0028 361/818 |
| 9,363,892 B2 * | 6/2016 | Steuer | H05K 9/0022 |
| 10,238,017 B2 * | 3/2019 | Kurz | H05K 7/2039 |
| 2008/0102701 A1 | 5/2008 | Suzuki et al. | |
| 2008/0165517 A1 | 7/2008 | Wang et al. | |
| 2011/0255850 A1 | 10/2011 | Dinh et al. | |
| 2013/0016484 A1 | 1/2013 | Yoo | |
| 2013/0042955 A1 | 2/2013 | Yeates et al. | |
| 2014/0362543 A1 | 12/2014 | Jang et al. | |
| 2016/0044835 A1 | 2/2016 | Lee et al. | |

FOREIGN PATENT DOCUMENTS

KR 10-2014-0132880 11/2014
KR 10-2016-0018236 2/2016

OTHER PUBLICATIONS

Written Opinion of the International Searching Authority dated Sep. 23, 2019, issued in International Application No. PCT/KR2019/007136.

* cited by examiner

STRUCTURE HAVING CIRCUIT BOARD DISPOSED ON UPPER FACE OF SHIELD CAN DISPOSED ON CIRCUIT BOARD, AND ELECTRONIC DEVICE INCLUDING SAME

CROSS-REFERENCE TO RELATED APPLICATION

This application is based on and claims priority under 35 U.S.C. § 119 to Korean Patent Application No. 10-2018-0070068, filed on Jun. 19, 2018, in the Korean Intellectual Property Office, the disclosure of which is incorporated by reference herein in its entirety.

BACKGROUND

Field

The present disclosure relates to a structure in which a circuit board is disposed on the upper face of a shield can disposed on a circuit board, and an electronic device including the structure.

Description of Related Art

An electronic device may output information stored therein as sound or an image. As the integration degree of electronic devices has increased and super-high speed and large-capacity RF communication have become popular, various functions have recently been provided in a single electronic device, such as a mobile communication terminal. For example, various functions, such as an entertainment function (e.g., a game function), a multimedia function (e.g., a music/video reproducing function), a communication and security function for mobile banking, a schedule management function, and an e-wallet function, are integrated into a single electronic device, in addition to a communication function. Various circuit components for providing the functions integrated as described above are mounted on a circuit board in an electronic device, and thus mounting space efficiency becomes important.

In communication devices mounted in electronic devices, efforts are underway to develop a next generation communication system such as a next generation (e.g., $5^{th}$ generation) communication system or a pre-next generation communication system in order to meet the growing demand for wireless data traffic, which is in an increasing trend after the commercialization of a 4G ($4^{th}$ generation) communication system. In order to achieve a high data transmission rate, the next generation communication system is being implemented in an ultra-high-frequency band (e.g., a band of 6 GHz or higher and 300 GHz or lower) such as a mm wave band. In order to mitigate a path loss of radio waves and to increase a transmission distance of radio waves in the ultra-high-frequency band, beam-forming technology, massive multi-input multi-output (massive MIMO) technology, full dimensional MIMO (FD-MIMO) technology, antenna array technology, analog beam-forming technology, and large-scale antenna technology are being developed in the next generation communication system.

In order to mount various circuit components such as a communication device in an electronic device, it is possible to increase the size of the circuit board on which the circuit components are arranged or to design the circuit boards in a stacked arrangement. Increasing the size of the circuit board may reduce the mounting efficiency of the electronic device. When circuit boards are stacked, since a shield can is applied to each of the circuit boards in order to shield the circuit components, the height of the stacked circuit boards may increase and the total component cost may increase.

As another example, an antenna structure used in the next generation communication (e.g., mm wave communication) may be influenced by the surrounding environment due to high-frequency characteristics. For example, the next-generation communication antennas may exhibit different performances depending on an actual installation environment even if the communication antennas have the same structure. For example, a structure for connecting a signal between circuit boards on which communication modules are mounted uses a flexible printed circuit board (FPCB), resulting in a loss depending on a line length.

SUMMARY

Various embodiments of the disclosure provide enhanced mounting efficiency according to reduction in the size of stacked circuit boards by implementing a structure in which a (e.g., another) circuit board is disposed on the upper face of a shield can disposed on a circuit board to shield spaces in which electronic components are mounted between the multiple circuit boards.

Various example embodiments disclosed herein may minimize and/or reduce a loss by removing a circuit board structure (FPCB) for connecting multiple circuit boards by directly connecting the multiple circuit boards through connectors, which are disposed on the multiple circuit boards to face each other.

An electronic device according to various embodiments may include: a first communication module comprising communication circuitry configured to process a communication signal in a first frequency band among multiple frequency bands corresponding to a specified communication method; a second communication module comprising communication circuitry configured to process a communication signal in a second frequency band among the multiple frequency bands; a first circuit board on which the first communication module and a first connector electrically connected to the first communication module are mounted; a shield can including an upper face, the upper face including at least one opening, and a the shield can further including a side face surrounding the upper face, the shield can being disposed on the first circuit board and accommodating the first communication module in an inner space formed by the upper face and the side face, the side face being electrically connected to a first ground portion of the first circuit board; a second circuit board on which the second communication module and a second connector electrically connected to the second communication module are mounted, the second circuit board being disposed on the upper face of the shield, wherein at least the second communication module corresponds to the first communication module or at least one component is mounted on the first circuit board in the inner space through a corresponding opening among the at least one opening wherein the second connector is electrically coupled to the first connector; and an adhesive disposed between the upper face and the second circuit board.

An electronic device according to various example embodiments may include: at least one first circuit component; at least one second circuit component; a first circuit board on which the at least one first circuit component and a first connector electrically connected to the at least one circuit component are mounted; a shield can including an upper face, the upper face including at least one opening and a side face surrounding the upper face, the shield can being disposed on the first circuit board and accommodating the at least one first circuit component in an inner space defined by the upper face and the side face, and the side face being electrically connected to a first ground portion of the first circuit board; a second circuit board on which the at least one second circuit component and a second connector electrically connected to the at least one second circuit component are mounted, the second circuit board being disposed on the upper face of the shield can such that the at least one second circuit component is stacked on the at least one circuit component in the inner space through the at least one opening wherein the second connector is electrically coupled to the first connector; and a conductive adhesive disposed between the upper face and the second circuit board.

An electronic device according to various example embodiments may include: a housing including a first plate oriented in a first direction, a second plate oriented in a second direction opposite the first direction, and a side face surrounding a space between the first plate and the second plate; a display exposed through at least a part of the first plate; a first circuit board disposed in the space and including a first communication module comprising communication circuitry configured to process a communication signal of a first frequency band and a first connector electrically connected to the first communication module; a second circuit board disposed to face at least a partial area of the first circuit board and including a second communication module comprising communication circuitry configured to process a communication signal of a second frequency band and a second connector electrically connected to the second communication module; a shield can disposed between the first circuit board and the second circuit board and including at least one opening; and a conductive adhesive configured to bond the second circuit board and the shield can to each other. The second communication module may be disposed in an inner space formed by the shield can through the at least one opening and to be stacked on the first communication module or at least one component mounted on the first circuit board, and the first connector and the second connector may be stacked to be electrically connected to each other.

An electronic device according to various example embodiments includes multiple circuit boards stacked and shielding a space in which electronic components between the multiple circuit boards are mounted using one shield can. Therefore, it is possible to improve a mounting space for electronic components.

An electronic device according to various example embodiments is capable of minimizing and/or reducing a loss by removing a circuit board structure (e.g., a FPCB) for connecting multiple circuit boards by directly connecting the multiple circuit boards through connectors, which are disposed on the multiple circuit boards to face each other.

According to various example embodiments, it is possible to improve the degree of design freedom of the inside of an electronic device while maintaining the performance of an RF communication device by arranging circuit components, such as a communication circuit, at various positions on stacked circuit boards.

BRIEF DESCRIPTION OF THE DRAWINGS

The above and other aspects, features, and advantages of certain embodiment of the present disclosure will be more apparent from the following detailed description, taken in conjunction with the accompanying drawings, in which.

DETAILED DESCRIPTION

Figure 1:
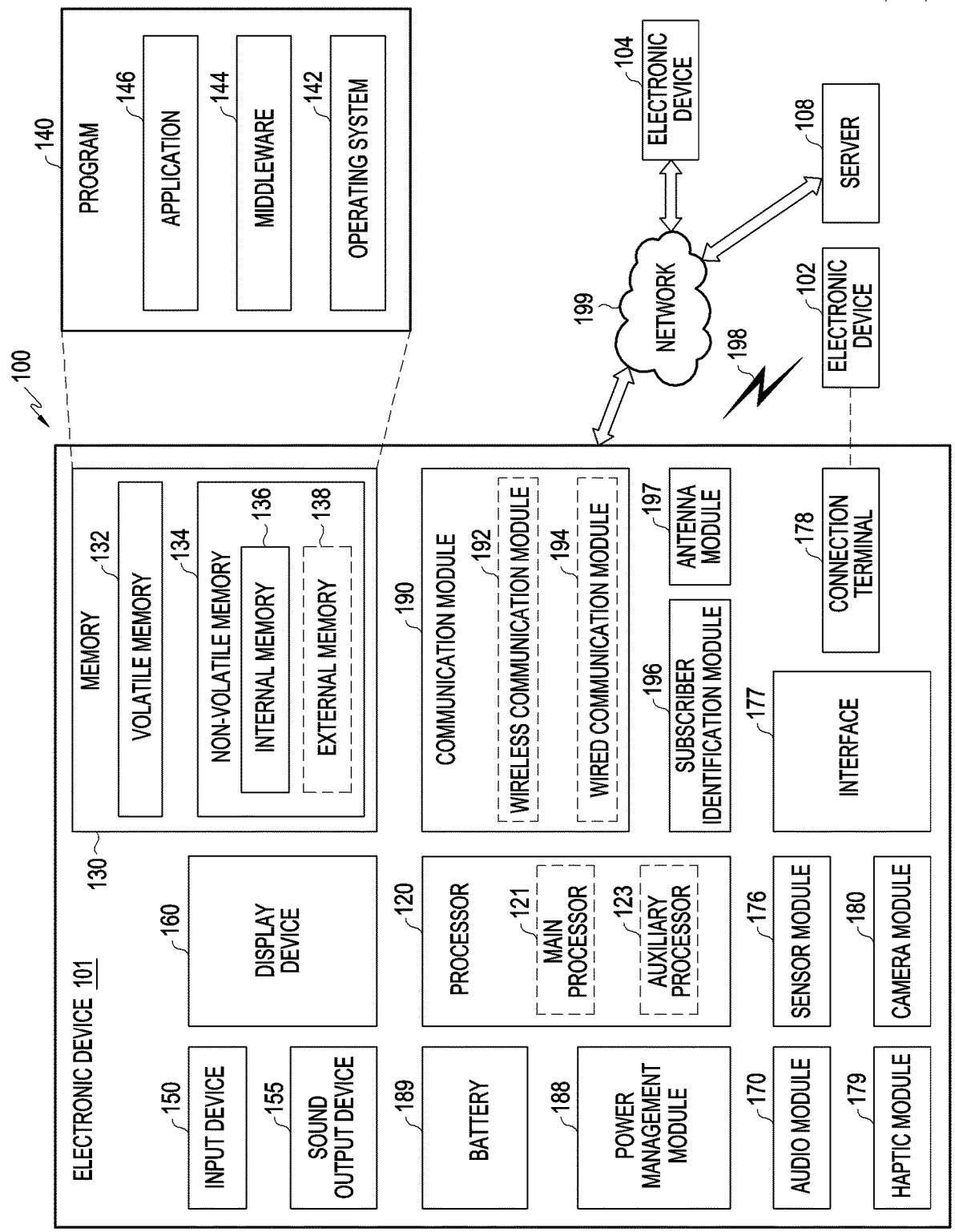
FIG. 1 is a block diagram illustrating an example electronic device in a network environment according to various embodiments.

FIG. 1 is a block diagram illustrating an electronic device 101 in a network environment 100 according to various embodiments.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
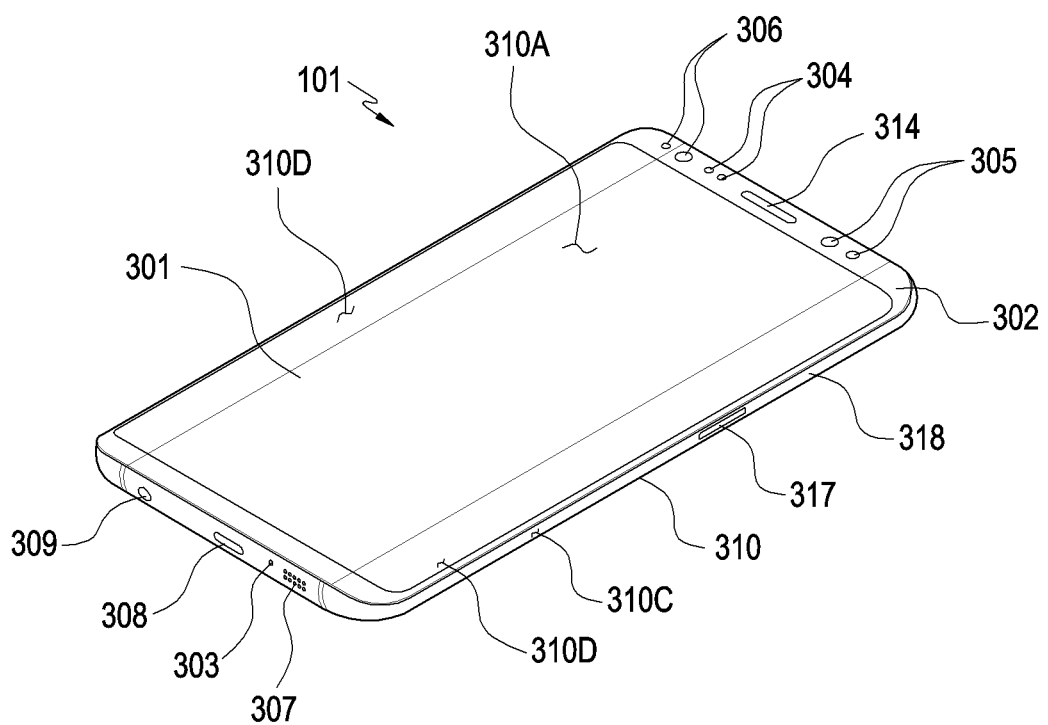
FIG. 2 is a front side perspective view illustrating an example electronic device according to various embodiments.
Figure 3:
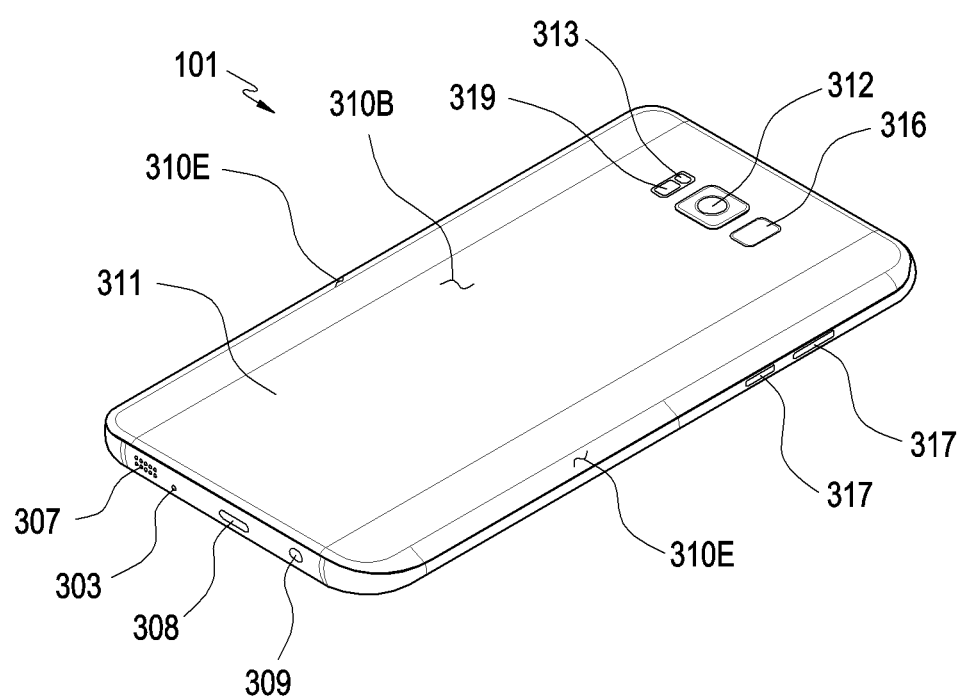
FIG. 3 is a rear side perspective view illustrating an example electronic device according to various embodiments.

FIG. 2 is a front side perspective view illustrating an example electronic device 101 according to various embodiments. FIG. 3 is a rear side perspective view illustrating the electronic device 101 of FIG. 2 according to various embodiments.

Referring to FIGS. 2 and 3, the electronic device 101 according to an embodiment may include a housing 310 including a first face (or a front face) 310A, a second face (or a rear face) 310B, and side faces 310C surrounding the space between the first face 310A and the second face 310B. In another embodiment (not illustrated), the term "housing" may refer to a structure forming a part of the first face 310A, the second face 310B, and the side faces 310C of FIG. 2.

According to an embodiment, at least a portion of the first face 310A may be formed by a substantially transparent front plate 302 (e.g., a glass plate or a polymer plate including various coating layers). The second face 310B may be formed of a substantially opaque rear plate 311. The rear plate 311 may be formed of, for example, and without limitation, coated or colored glass, ceramic, a polymer, or a metal (e.g., aluminum, stainless steel (STS), or magnesium), or any combination of two or more of these materials. The side faces 310C may be formed by a side bezel structure (or a "side member") 318 coupled to the front plate 302 and the rear plate 311 and including, for example, and without limitation, a metal and/or a polymer. In some embodiments, the rear plate 311 and the side bezel structure 318 may be integrally formed, and may include the same material (e.g., a metal material such as aluminum).

In the illustrated embodiment, the front plate 302 may include, at the long opposite side edges thereof, two first areas 310D, which are bent from the first face 310A toward the rear plate 311 and extend seamlessly. In the illustrated embodiment (see FIG. 3), the rear plate 311 may include, at the long opposite side edges thereof, two second areas 310E, which are bent from the second face 310B toward the front plate 302 and extend seamlessly. In some embodiments, the front plate 302 (or the rear plate 311) may include only one of the first areas 310D (or the second areas 310E). In another embodiment, some of the first areas 310D and the second areas 310E may not be included. In the above embodiments, when viewed from a side of the electronic device 101, the side bezel structure 318 may have a first thickness (or width) on the side faces, which do not include the first areas 310D or the second areas 310E, and may have a second thickness (or width), which is thinner than the first thickness, on the side faces which include the first areas 310D or the second areas 310E.

According to an embodiment, the electronic device 101 may include at least one of a display 301, audio modules 303, 307, and 314, sensor modules 304, 316, and 319, camera modules 305, 312, and 313, key input devices 317, light-emitting elements 306, and connector holes 308 and 309. In some embodiments, at least one of the components (e.g., the key input devices 317 or the light-emitting elements 306) may be omitted from the electronic device 101, or the electronic device 101 may additionally include other components.

The display 301 may be exposed through a substantial portion of, for example, the front plate 302. In some embodiments, at least a part of the display 301 may be exposed through the front plate 302 forming the first face 310A and the first areas 310D of the side faces 310C. In some embodiments, the edges of the display 301 may be formed to be substantially the same as the contour shape of the front plate 302 adjacent thereto. In another embodiment (not illustrated), the distance between the outer contour of the display 301 and the outer contour of the front plate 302 may be substantially constant in order to enlarge the exposed area of the display 301.

In another embodiment (not illustrated), a recess or an opening is disposed in a part of a screen display area of the display 301, and at least one of the audio module 314, the sensor module 304, the camera module 305, and the light-emitting element 306 may be aligned with the recess or the opening. In another embodiment (not illustrated), at least one of the audio module 314, the sensor module 304, the camera module 305, the fingerprint sensor 316, and the light-emitting element 306 may be included in the rear face of the screen display area of the display 301. In another embodiment (not illustrated), the display 301 may be coupled to or disposed adjacent to a touch-sensing circuit, a pressure sensor capable of measuring the intensity of the touch (pressure), and/or a digitizer that detects a stylus pen. In some embodiments, at least some of the sensor modules 304 and 319 and/or at least some of the key input devices 317 may be disposed in the first areas 310D and/or the second areas 310E.

The audio modules 303, 307, and 314 may include a microphone hole 303 and speaker holes 307 and 314. The microphone hole 303 may include a microphone disposed therein so as to acquire external sound, and in some embodiments, multiple microphones may be disposed therein so as to detect the direction of sound. The speaker holes 307 and 314 may include an external speaker hole 307 and a phone call receiver hole 314. In some embodiments, the speaker holes 307 and 314 and the microphone hole 303 may be implemented as a single hole, or a speaker may be included therein without the speaker holes 307 and 314 (e.g., a piezo speaker).

The sensor modules 304, 316, and 319 may generate electrical signals or data values corresponding to an internal operating state or an external environmental condition of the electronic device 101. The sensor modules 304, 316, and 319 may include, for example, a first sensor module 304 (e.g., a proximity sensor) and/or a second sensor module (not illustrated) (e.g., a fingerprint sensor) disposed on the first face 310A of the housing 310, and/or a third sensor module 319 (e.g., an HRM sensor) and/or a fourth sensor module 316 (e.g., a fingerprint sensor) disposed on the second face 310B of the housing 310. The fingerprint sensor may be disposed not only on the first face 310A of the housing 310 (e.g., the display 301), but also on the second face 310B. The electronic device 101 may further include at least one of sensor modules (not illustrated), such as a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, and an illuminance sensor.

The camera modules 305, 312, and 313 may include a first camera device 305 disposed on the first face 310A of the electronic device 101 and a second camera device 312 disposed on the second surface 310B, and/or a flash 313. The camera modules 305 and 312 may include one or more lenses, an image sensor, and/or an image signal processor. The flash 313 may include, for example, a light-emitting diode or a xenon lamp. In some embodiments, two or more lenses (e.g., an infrared camera lens, a wide-angle lens, and a telephoto lens) and image sensors may be disposed on one face of the electronic device 101.

The key input devices 317 may be disposed on the side faces 310C of the housing 310. In another embodiment, the electronic device 101 may not include some or all of the above-mentioned key input devices 317, and a key input device 317, which is not included therein, may be implemented in another form such as a soft key on the display 301. In some embodiments, the key input devices may include a sensor module 316 disposed on the second face 310B of the housing 310.

The light-emitting element 306 may be disposed, for example, on the first face 310A of the housing 310. The light-emitting element 306 may provide, for example, the status information of the electronic device 101 in an optical form. In another embodiment, the light-emitting element 306 may provide a light source that is interlocked with, for example, the operation of the camera module 305. The light-emitting element 306 may include, for example, an LED, an IR LED, and a xenon lamp.

The connector holes 308 and 309 may include a first connector hole 308 capable of accommodating a connector (e.g., a USB connector) for transmitting and receiving power and/or data to and from an external electronic device, and/or a second connector hole 309 capable of receiving a connector (e.g., an earphone jack) for transmitting and receiving an audio signal to and from an electronic device.

Figure 4:
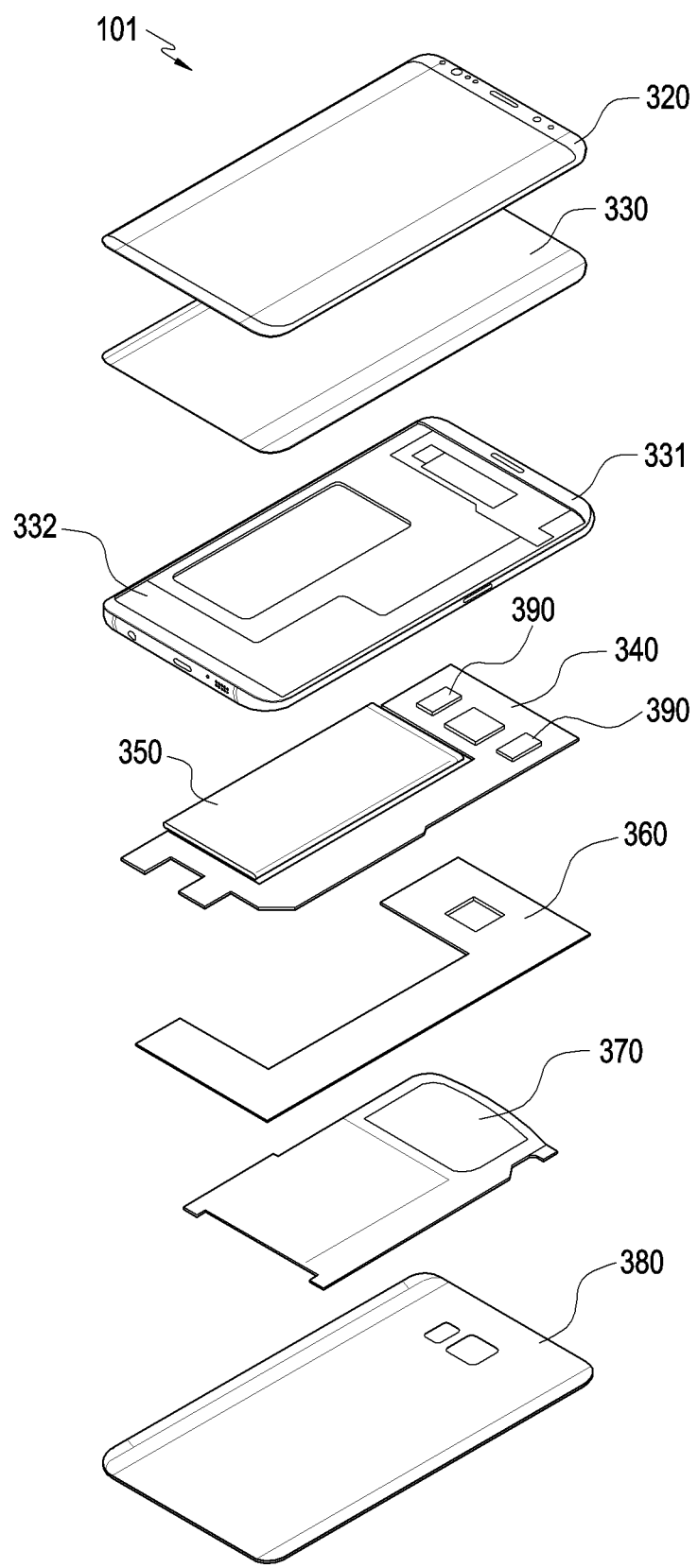
FIG. 4 is an exploded perspective view illustrating an example electronic device according to various embodiments.

FIG. 4 is an exploded perspective view illustrating the electronic device 101 according to various embodiments.

Referring to FIG. 4, an electronic device 101 (e.g., the electronic device 101 in FIGS. 1 to 3) may include a side bezel structure 331, a first support member 332 (e.g., a bracket), a front plate 320, a display 330, a printed circuit board 340, a battery 350, a second support member 360 (e.g., a rear case), an antenna 370, and a rear plate 380. In some embodiments, at least one of the components (e.g., the first support member 332 or the second support member 360) may be omitted from the electronic device 101, or the electronic device 101 may additionally include other components. At least one of the components of the electronic device 101 may be the same as or similar to at least one of the components of the electronic device 101 of FIG. 2 or 3, and a redundant description thereof is omitted below.

The first support member 332 may be disposed inside the electronic device 101 and may be connected to the side bezel structure 331 or may be formed integrally with the side bezel structure 331. The first support member 332 may be formed of, for example, a metal material and/or a non-metal (e.g., polymer) material. The display 330 may be coupled to a first face of the first support member 332, and the printed circuit board 340 may be coupled to a second face of the first support member 332. On the printed circuit board 340, a processor, a memory, and/or an interface may be mounted. The processor may include at least one of, for example, and without limitation, a central processing unit, an application processor, a graphic processor, an image signal processor, a sensor hub processor, and/or a communication processor.

The memory may include, for example, volatile memory and/or nonvolatile memory.

The interface may include, for example, and without limitation, a high-definition multimedia interface (HDMI), a universal serial bus (USB) interface, an SD card interface, and/or an audio interface. The interface may electrically or physically connect, for example, the electronic device 101 to an external electronic device, and may include a USB connector, an SD card/an MMC connector, or an audio connector.

The battery 350 is a device for supplying power to at least one component of the electronic device 101, and may include, for example, and without limitation, a non-rechargeable primary battery, a rechargeable secondary battery, and/or a fuel cell. At least a portion of the battery 350 may be disposed to be substantially flush with, for example, the printed circuit board 340. The battery 350 may be integrally disposed within the electronic device 101, or may be detachably mounted on the electronic device 101.

The antenna 370 may be disposed between the rear plate 380 and the display 350. The antenna may include, for example, and without limitation, a near-field communication (NFC) antenna, a wireless charging antenna, and/or a magnetic secure transmission (MST) antenna. The antenna 370 may perform short-range communication with, for example, an external electronic device, or may transmit/receive power required for charging to/from the external device in a wireless manner. In another embodiment, an antenna structure may be formed by the side bezel structure 331, a portion of the first support member 332, or a combination thereof.

According to various embodiments, an electronic device may include multiple communication devices 390, each including various communication circuitry. For example, some of the multiple communication devices 390 may be implemented in order to transmit and receive radio waves having different characteristics (provisionally referred to as radio waves of A and B frequency bands) for MIMO implementation. As another example, some of the multiple communication devices 390 may, for example, simultaneously transmit and receive radio waves having the same characteristics (provisionally referred to as radio waves having A1 and A2 frequencies in the A frequency band) for diversity implementation. As another example, the remaining ones of the multiple communication devices 390 may, for example, simultaneously transmit and receive radio waves having the same characteristics (provisionally referred to as radio waves having B1 and B2 frequencies in the B frequency band) for diversity implementation. In an embodiment of the disclosure, the electronic device 101 may include two communication devices, but, in another embodiment of the disclosure, the electronic device 101 may include four communication devices so as to simultaneously implement MIMO and diversity. In yet another embodiment, the electronic device 101 may include only one communication device 390.

According to an embodiment, in consideration of the transmission/reception characteristics of radio waves, when one communication device is disposed at a first position on the printed circuit board 340, another communication device may be disposed at a second position, which is separated from the first position on the printed circuit board 340. As another example, one communication device and another communication device may be arranged in consideration of the mutual separation distance between one communication device and another communication device according to a diversity characteristic.

According to an embodiment, at least one communication device 390 may include an RF communication circuit that processes radio waves transmitted/received in an ultra-high-frequency band (e.g., 6 GHz or higher and 300 GHz or lower). The radiation conductor(s) (e.g., the radiation conductors 690 in FIG. 7A) of the at least one communication device 390 may include, for example, a patch-type radiation conductor or a radiation conductor having a dipole structure extending in one direction, and multiple radiation conductors may be arrayed to form an antenna array. For example, a chip in which some of the RF communication circuits are implemented (e.g., an integrated circuit chip) may be disposed on one side of the area in which the radiation conductor is disposed or on the face that faces away from the face on which the radiation conductor is disposed, and may be electrically connected to the radiation conductor(s) through wiring made of a printed circuit pattern.

Figure 5:
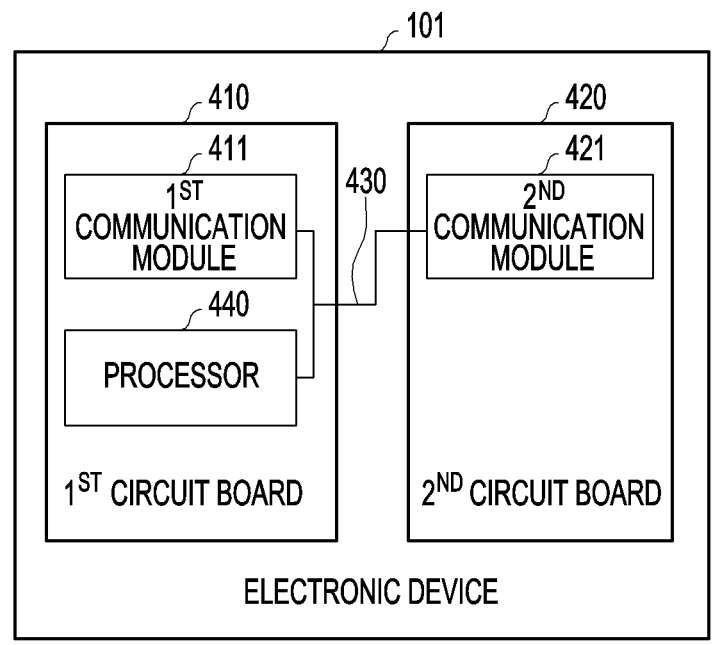
FIG. 5 is a block diagram illustrating an example of an electronic device that supports various RF communication according to various embodiments.

FIG. 5 is a block diagram illustrating an example of an electronic device 101 that supports various communication modules.

Referring to FIG. 5, the electronic device 101 may include a processor (e.g., including processing circuitry) 440 (e.g., the processor 120 in FIG. 1), a first and second communication module (e.g., including communication circuitry) 411, 421, respectively, (e.g., the communication module 190 in FIG. 1), and/or a conductive line 430.

According to an embodiment, the electronic device 101 may include at least one communication module. For example, the electronic device 101 may include at least one of a first communication module (e.g., including communication circuitry) 411 disposed on a first circuit board 410 and a second communication module (e.g., including communication circuitry) 421 disposed on a second circuit board 420.

According to an embodiment, the first communication module 411 and the second communication module 421 may be located inside the electronic device 101. According to an embodiment, when viewed from above the rear plate of the electronic device, the first communication module 411 or the second communication module 421 may, for example, and without limitation, be located at the upper-left end of the electronic device 101, at the upper-right end of the electronic device 101, at the lower-left end of the electronic device 101, or at the lower-right end of the electronic device 101.

According to an embodiment, the processor 440 may be disposed on the first circuit board 410, and may include various processing circuitry, such as, for example, and without limitation, one or more of a central processing unit, an application processor, a graphic processing unit (GPU), a camera image signal processor, and/or a baseband processor (or a communication processor (CP)). According to an embodiment, the processor 440 may be implemented as a system-on-chip (SoC) or a system-in package (SiP).

According to an embodiment, the communication module 411 may be electrically connected to the second communication module 421 using at least one conductive line 430. The first communication module 411 and/or the second the communication module 421 may include various communication circuitry, such as, for example, and without limitation, a baseband processor and/or at least one communication circuit (e.g., an intermediate frequency integrated circuit (IFIC), and/or a radio frequency integrated circuit (RFIC). The first communication module 411 and/or the second communication module 421 may be electrically connected to, for example, a baseband processor (e.g., an application processor (AP)) separate from the processor 440. The conductive line 430 may include, for example, a coaxial cable or an FPCB.

According to an embodiment, the first communication module 411 or the second communication module 421 may include a first baseband processor (BP) (not illustrated) or a second base band (BP) (not illustrated). The electronic device 101 may further include one or more interfaces for supporting chip-to-chip communication between the first BP (or the second BP) and the processor 440. The processor 440 and the first BP or the second BP may transmit and receive data using an inter-chip interface (inter-process communication channel).

According to an embodiment, the first BP or the second BP may provide an interface for performing communication with other entities. The first BP may support, for example, RF communication for a first network (not illustrated). The second BP may support, for example, RF communication for a second network (not illustrated).

According to an embodiment, the first BP or the second BP may form one module with the processor 440. According to an embodiment, the first BP or the second BP may be integrally formed with the processor 440. As another example, the first BP or the second BP may be disposed in one chip, or may be formed in the form of an independent chip. According to an embodiment, the processor 440 and at least one BP (e.g., the first BP) may be integrally formed in one chip (an SoC chip), and the other BP (e.g., the second BP) may be formed in the form of an independent chip.

According to an embodiment, the first network (not illustrated) or the second network (not illustrated) may correspond to the network 199 of FIG. 1. According to an embodiment, each of the first network (not illustrated) and the second network (not illustrated) may include a $4^{th}$ generation (4G) network and a $5^{th}$ generation (5G) network. The 4G network may support, for example, a long-term evolution (LTE) protocol defined in the 3GPP. The 5G network may support, for example, the new radio (NR) protocol defined in the 3GPP.

Figure 6:
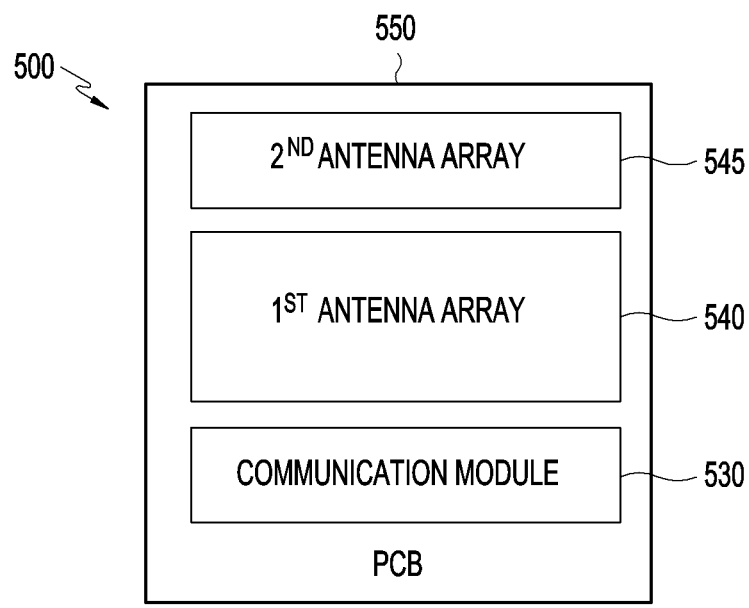
FIG. 6 is a block diagram illustrating an example second circuit board of FIG. 5 according to various embodiments.

FIG. 6 is a block diagram illustrating an example second circuit board of FIG. 5.

Referring to FIG. 6, on a second circuit board 550 (e.g., the second circuit board 420 in FIG. 5), a communication module (e.g., including communication circuitry) 530 (e.g., the second communication module 421 in FIG. 5) (e.g., an RFIC), a first antenna array 540, and/or a second antenna array 545 may be mounted.

According to an embodiment, on the PCB 550, a communication circuit of a communication module 530, a first antenna array 540, and/or a second antenna array 545 may be disposed. For example, the first antenna array 540 and/or the second antenna array 545 may be disposed on a first face of the PCB 550, and the communication module 530 may be disposed on the second face of the PCB 550. The PCB 550 may include a connector (e.g., a coaxial cable connector or a board to board (B-to-B) connector) to be electrically connected to another PCB (e.g., the first circuit board 410 on which the first communication module 411 of FIG. 5 is disposed) using a transmission line (e.g., the conductive line 430 in FIG. 5 or a coaxial cable). The PCB 550 may be connected to a PCB on which a communication module (e.g., the first communication module 411 in FIG. 5) is disposed using, for example, a coaxial cable connector, and the coaxial cable may be used for delivering transmission and reception intermediate frequency (IF) signals or RF signals. As another example, power or other control signals may be communicated through the B-to-B connector.

According to an embodiment, the first antenna array 540 and/or the second antenna array 545 may include multiple antennas. The antennas may include, for example, and without limitation, a patch antenna, a loop antenna, and/or a dipole antenna. For example, the multiple antennas included in the first antenna array 540 may be patch antennas in order to form a beam toward the rear plate of the electronic device 101. As another example, the multiple antennas included in the second antenna array 545 may be a dipole antenna or a loop antenna in order to form a beam toward the side member of the electronic device 101.

According to an embodiment, the communication circuit of the communication module 530 may support at least a part of a band from about 6 GHz to 300 GHz (e.g., from about 24 GHz to about 30 GHz or from 37 GHz to 40 GHz). According to an embodiment, the communication module 530 may upconvert or downconvert a frequency. For example, the communication module 530 included in the electronic device 101 may upconvert an IF signal received through a conductive line (e.g., the conductive line in FIG. 5) into an RF signal. As another example, the electronic device 101 may downconvert an RF signal (e.g., a mm wave signal) received via the first antenna array 540 or the second antenna array 545 into an IF signal, and may transmit the IF signal to the communication module 530 using a conductive line.

Figure 7A:
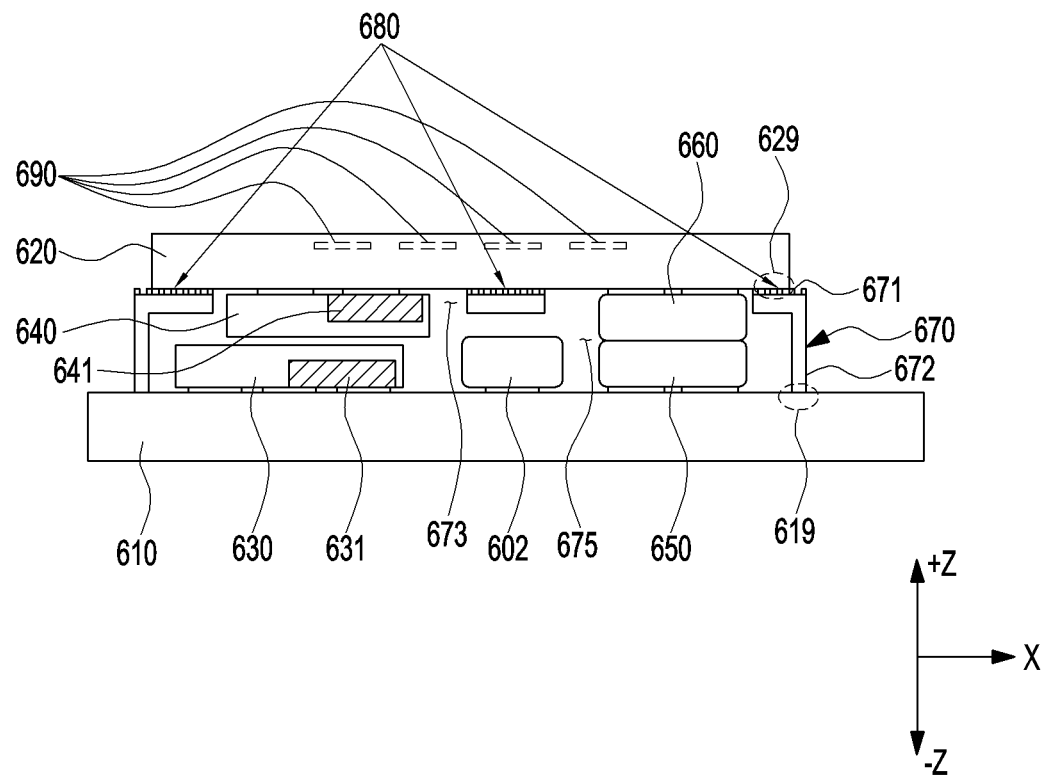
FIG. 7A is a cross-sectional view illustrating an example stacked structure of circuit boards disposed within an electronic device according to various embodiments.
Figure 7B:
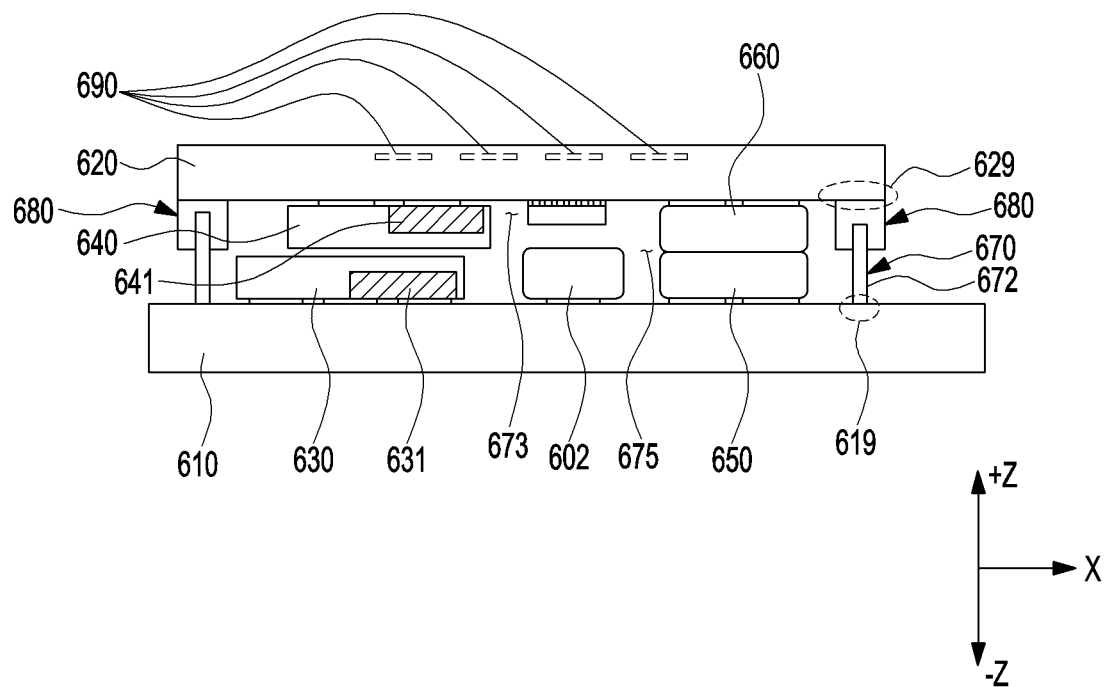
FIG. 7B is a cross-sectional view illustrating an example stacked structure of circuit boards including different adhesive members compared with FIG. 7A according to various embodiments.

FIG. 7A is a cross-sectional view illustrating an example stacked structure of circuit boards disposed within an electronic device according to various embodiments. FIG. 7B is a cross-sectional view illustrating an example stacked structure of circuit boards including different adhesive members compared with FIG. 7A. The structures of the circuit boards in FIGS. 7A and 7B and the components disposed thereon may be partly or wholly the same as, or similar to, the structures of the printed circuit board 340 in FIG. 4 or the components disposed thereon and/or the structures the PCB 550 in FIG. 6 or the components disposed thereon.

In FIGS. 7A and 7B, "X" in a 2-axis orthogonal coordinate system may represent the longitudinal direction of the circuit board, and "Z" may represent the thickness direction of the circuit board. In an embodiment of the disclosure, "Z" may represent a first direction (+Z) or a second direction (−Z).

According to various embodiments, an electronic device (e.g., the electronic device 101 in FIGS. 1 to 5) may include a first circuit board 610 (e.g., the first circuit board 410), a second circuit board 620 (e.g., the second circuit board 420 in FIG. 5) stacked on at least a partial area of the first circuit board 610, a first communication module (e.g., including communication circuitry) 630 (e.g., the first communication module 411 in FIG. 5) disposed on the first circuit board 610, a second communication module 640 (e.g., the second communication module 421 in FIG. 5) disposed on the second circuit board 620, a shield can 670 disposed between the first circuit board 610 and the second circuit board 620, and a conductive adhesive member (e.g., including a conductive adhesive) 680, at least a part of which is disposed between the second circuit board 620 and the shield can 670.

According to various embodiments, the electronic device 101 may include a processor (e.g., the processor 120 in FIG. 1 or the processor 440 in FIG. 5) mounted on the first circuit board 610 (e.g., a main circuit board), a power management module (e.g., the power management module 188 in FIG. 1), and a first RF transceiver 631. According to an embodiment, the electronic device 101 may include a second circuit board 620 (e.g., an auxiliary circuit board) disposed adjacent to the first circuit board 610, a second communication module 640 disposed on a first face of the second circuit board 620 and an array of radiation conductors 690 (e.g., conductive plates) disposed on a second face of the second circuit board 620. As another example, the array of radiation conductors 690 may not be included on the second circuit board 620.

According to various embodiments, the first circuit board 610 may include a first communication module 630 (e.g., the communication module 190 or the RF communication module 192 in FIG. 1) and a first connector 650 electrically connected to the first communication module 630. The second circuit board 620 may include a second communication module 640 (e.g., the communication module 190 or the RF communication module 192 in FIG. 1) and a second connector 660 electrically connected to the second communication module 640. The first connector 650 and the second connector 660 may be electrically connected to each other.

At least one passive element 602, such as a resistor, a capacitor, and an inductor, may be disposed on the first circuit board 610.

According to various embodiments, the first communication module 630 may include a first RF transceiver 631 and may be disposed on the first circuit board 610 (e.g., a main circuit board). A processor 120 or 440 or a power management module 188 (e.g., a PMIC) may be mounted on the first circuit board 610, and the power management module 188 may be controlled by the processor 120 or 440. The first communication module 630 includes an RF communication circuit, and may be configured to process a communication signal in a first designated frequency band among multiple designated frequency bands corresponding to a designated communication method. The communication signals in the first designated frequency band, which have been processed through the first communication module 630, may be transmitted to the second communication module 640 through the processor 120 or 440.

According to an embodiment, the processor 120 or 440 may include at least a communication processor, or may have a configuration in which an integrated application processor and a communication processor are integrated with each other, and may control or drive the first RF transceiver 631, the power management module 188, the first communication module 630, and the like. According to an embodiment, the power management module 188 may manage the power supplied to the processor 120 or 240, the first RF transceiver 631, the first communication module 630, or the other electronic components in the electronic device 101 under the control of the processor 120 or 240. In some embodiments, the power management module 188 may provide a power signal to a temperature-controlled crystal oscillator (TCXO)/a crystal oscillator (XO), and the TCXO/XO may generate and provide a clock signal to the RF transceiver 631, the processor 120 or 240, or the power management module 188.

According to an embodiment, the first RF transceiver 631 may communicate a reception (Rx) digital signal, a transmission (Tx) analog I/Q signal, or a control signal with the processor 120 or 240. In some embodiments, the RF transceiver 490 may generate and provide a communication signal to the second communication module 640.

According to various embodiments, the electronic device 101 may include the second circuit board 620 (e.g., an auxiliary circuit board), the second communication module 640 (e.g., a communication circuit) mounted on the second circuit board, and a radiation conductor(s) 690. For example, the electronic device 101 may have a structure in which the second communication module 640 and the radiation conductor(s) 690 are disposed on one circuit board so as to be oriented in different directions. According to an embodiment, the second communication module 640 may be configured to process communication signals of a second designated frequency band among multiple designated frequency bands corresponding to a designated communication method. For example, the processor 120 or 240 may be configured to process the communication signal of the first designated frequency band transmitted to the second communication module 640 as an RF signal (e.g., a communication signal of the second designated frequency band) and to transmit the final communication signal through the radiation conductor(s) 690.

According to an embodiment, the second communication module 640 may include an RF communication circuit, and may receive a communication signal through the first RF transceiver 631 or may transmit the received communication signal to the radiation conductor(s) 690 via the second RF transceiver 641. For example, the second communication module 640 may perform RF communication using the radiating conductor(s) 690 under the control of the processor 120 or 440. In another embodiment, the second communication module 640 may receive control signals and power from the processor 120 or 440 and the power management module 188, and may process communication signals received from the outside or communication signals to be transmitted to the outside. For example, the second communication module 640 may include a switch circuit for separating transmission/reception signals or various amplifiers and filter circuits for improving transmission/reception signal quality.

According to various embodiments, when the multiple radiation conductors 690 form an antenna array, the second communication module 640 may include a phase shifter connected to each radiation conductor, thereby controlling the direction of the electronic device 101. For example, when the electronic device 101 includes an antenna array, the second communication module 640 may provide phase difference feeding to each radiation conductor so as to control the directivity of the electronic device 101. This phase difference feeding may be useful for ensuring an optimal communication environment or a good communication environment in a communication method having strong linearity, such as mm wave communication (e.g., RF communication using a frequency band of about 6 GHz or higher and about 300 GHz or lower).

According to various embodiments, the first communication module 630 may be disposed to correspond to (e.g., at least partially overlap) the second communication module 640. For example, the first communication module 630 may be disposed adjacent to the second communication module 640. As another example, at least a partial area of the first communication module 630 and the second communication module 640 may be stacked to overlap each other when viewed from the front side of the electronic device 101. At least a partial area of the first communication module 630 and the second communication module 640 may be disposed to be parallel to each other so as to overlap each other when viewed from a lateral side of the electronic device 101. As another example, at least a partial area of the first communication module 630 and the second communication module 640 may be disposed to be parallel to each other in the vertical direction (in the +Z or −Z direction) or may be disposed to be parallel to each other in the horizontal direction.

According to various embodiments, the second circuit board 620 may be connected to the first circuit board 610 through a connector structure. For example, a first connector 650 electrically connected to the first communication module 630 may be mounted on the first circuit board 610, and a second connector 660 electrically connected to the second communication module 630 may be mounted on the second circuit board 620. The first connector 650 on the first circuit board 610 may be disposed to face the second connector 660 on the second circuit board 620, and may be electrically connected to the second connector 660. For example, the first connector 650 may be disposed to be oriented in a first direction (+Z) and the second connector 660 may be disposed to be oriented in a second direction (−Z), which is opposite the first direction (+Z). The connection between the first connector 650 and the second connector 660 may provide a line for transmitting a data signal from the first circuit board 610 to the second circuit board 620, or may provide a line for transmitting a communication signal. For example, the data signal may be a control signal or power, and the communication signal may be an RF signal. In some embodiments, a signal received via the electronic device 101 may be transmitted to the first circuit board 610 via the connector structure.

According to various embodiments, the shield can 670 may be disposed between the first circuit board 610 and the second circuit board 620, which are stacked one on another. The shield can 670 may include an upper face 671 including at least one opening 673, a side face 672 surrounding the upper face 671, and an inner space 675 formed by the upper face 671 and the side face 672. According to an embodiment, the electronic components disposed on the second circuit board 620 (e.g., the second communication module 640 or the second connector 660) may be disposed to pass through the opening 673 and may be positioned to face the inner space 675. For example, the electronic components disposed on the second circuit board 620 may be disposed to be oriented in the second direction (−Z). The side face 672 may be electrically connected to a first ground portion 619 of the first circuit board 610. The inner space 675 may accommodate various electronic components mounted on the first communication module 630, the second communication module 640, and/or the circuit board. As another example, the first connector 650 and the second connector 660 may be accommodated in the inner space 675.

According to various embodiments, the adhesive member 680 may be disposed between the upper face 671 of the shield can 670 and a second ground portion 629 of the second circuit board 620. The adhesive member 680 may include a conductive material, in which a first face of the adhesive member may be bonded to the upper face 671 of the shield can 670 and a second face of the second circuit board 620 so as to seal the inner space 675. As another example, the adhesive member 680 may be formed so as to enclose various electronic components disposed on the second circuit board 620, thereby shielding the components from each other. Referring to FIG. 7A, the adhesive member 680 may include conductive adhesive tape, and the conductive adhesive tape may electrically connect the upper face 671 of the shield can 670 to the second ground portion 629 of the second circuit board 620. The conductive adhesive tape may be manufactured to include at least one opening to correspond to the shape of the upper face 671 of the shield can 670, and the electronic components disposed on the second circuit board 620 may be disposed to pass through the opening so as to face the inner space.

Referring to FIG. 7B, the adhesive member 680 may include a conductive clip made of a metal material. One end of the conductive clip may be coupled to enclose at least a portion of the side face 672 of the shield can 670, and the other end of the conductive clip may be electrically connected to the second ground portion 629 of the second circuit board 620. Multiple conductive clips may be disposed along the edges of the upper face 671 of the shield can 670 at designated intervals.

According to various embodiments of the disclosure, the first circuit board 610 and the second circuit board 620 may be stacked one on another, and a space in which electronic components disposed between the first circuit board 610 and the second circuit board 620 is shielded by the shield can 670 and the conductive member 680, so that it is possible to increase the space in which the electronic components may be arranged and to reduce the height of a mounting space occupied in the electronic device by the stacked circuit board structure. As another example, it is possible to improve the degree of design freedom in the electronic device while maintaining the performance of an RF communication device.

Figure 8:
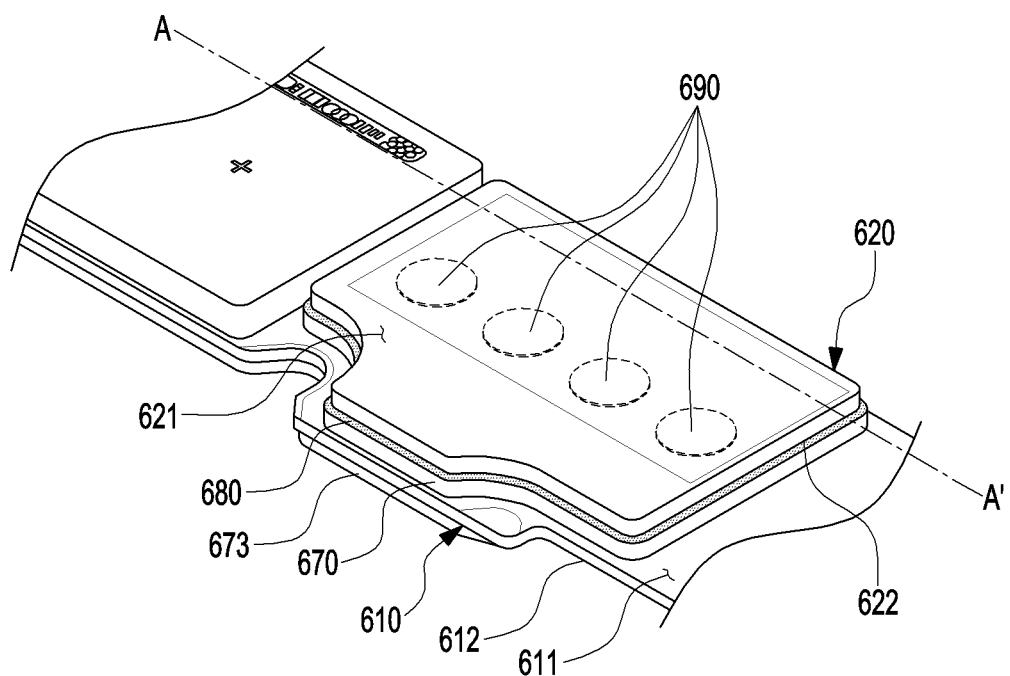
FIG. 8 is a perspective view illustrating an example stacked circuit board structure according to various embodiments.
Figure 9:
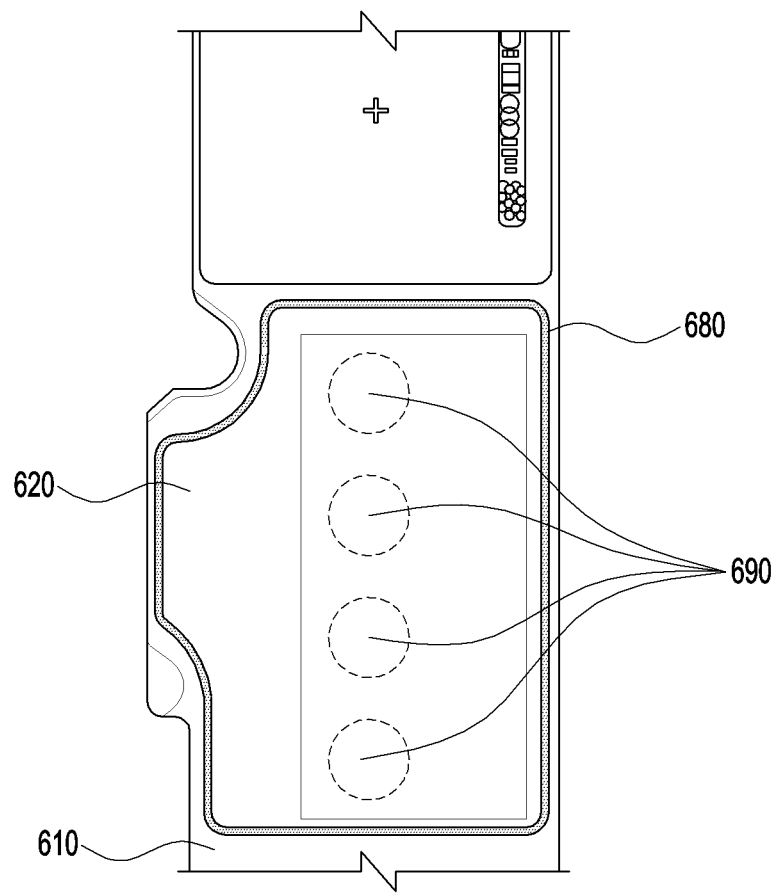
FIG. 9 is a top view illustrating an example array of radiation conductors disposed on a face of the circuit board according to various embodiments.
Figure 10:
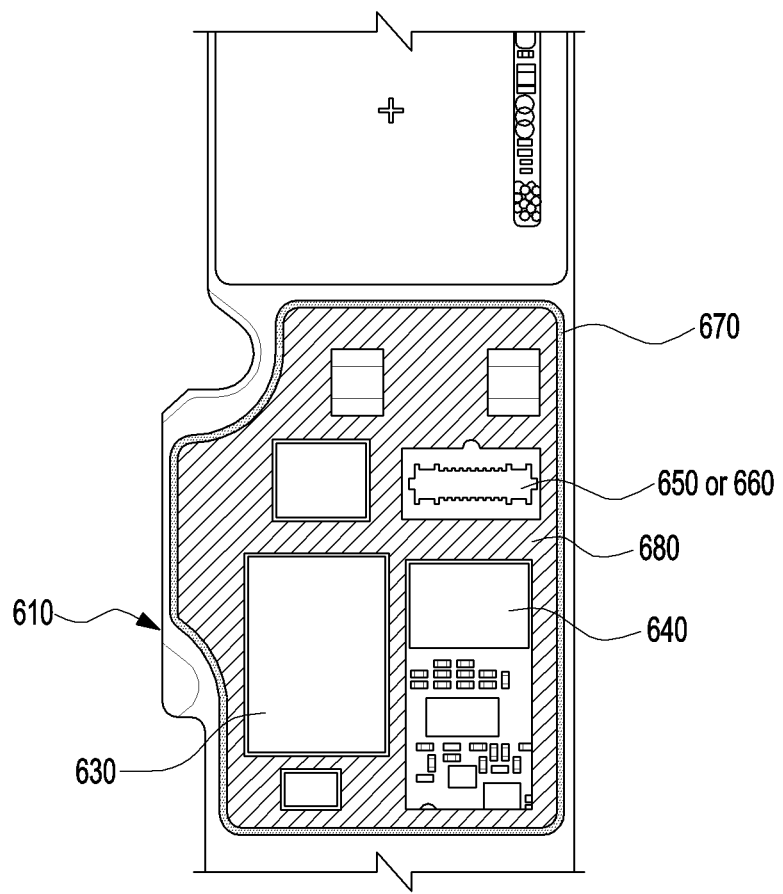
FIG. 10 is a diagram illustrating an example adhesive member and electronic components located in a stacked circuit board structure according to various embodiments.

FIG. 8 is a perspective view illustrating an example stacked circuit board structure according to various embodiments. FIG. 9 is a top view illustrating an example array of radiation conductors disposed on a face of the circuit board according to various embodiments. FIG. 10 is a diagram illustrating an example adhesive member and electronic components located in a stacked circuit board structure according to various embodiments.

Referring to FIGS. 8, 9 and 10, an electronic device (e.g., the electronic device 101 in FIGS. 1 to 5) may include a first circuit board 610, a second circuit board 620 stacked on at least a partial area of (e.g., at least partially overlapping) the first circuit board 610, a first communication module 630 disposed on the first circuit board 610, a second communication module 640 disposed on the second circuit board 620, a shield can 670 disposed between the first circuit board 610 and the second circuit board 620, and a conductive adhesive member (e.g., including a conductive adhesive) 680, at least a part of which is disposed between the second circuit board 620 and the shield can 670. The structures of the first circuit board 610, the second circuit board 620, the first communication module 630, the second communication module 640, the shield can 670, and the conductive adhesive member 680 in FIGS. 8, 9 and 10 may be the same as or similar to all or part of the structures of the first circuit board 610, the second circuit board 620, the first communication module 630, the second communication module 640, the shield can 670, and the conductive adhesive member 680 in FIG. 7A.

In FIG. 8, an "X-axis" in an orthogonal coordinate system of three axes may represent the longitudinal direction of the circuit board, a "Y-axis" may represent the width direction of the circuit board, and a "Z-axis" may represent the thickness direction of the circuit board. In an embodiment of the disclosure, "Z" may represent a first direction (+Z) or a second direction (−Z).

According to various embodiments, the first circuit board 610 and the second circuit board 620 may be disposed to be spaced apart from each other and to face each other. For example, at least a partial area of the first circuit board 610 and at least a partial area of the second circuit board 620 may be stacked to overlap each other when viewed from above the stacked circuit boards. According to an embodiment, the first circuit board 610 may include a $(1\text{-}1)^{th}$ face 611 oriented in the first direction (+Z) and a $(1\text{-}2)^{th}$ face 612 oriented in the second direction (−Z), which is opposite the first direction (+Z). Various electronic components including the first communication module 630 may be mounted on the $(1\text{-}1)^{th}$ face 611 and/or the $(1\text{-}2)^{th}$ face 612. The second circuit board 620 may include a $(2\text{-}1)^{th}$ face 621 oriented in the first direction (+Z) and a $(2\text{-}2)^{th}$ face 622 oriented in the second direction (−Z). Various electronic components including the second communication module 640 may be mounted on the $(2\text{-}1)^{th}$ face 621 and/or the $(2\text{-}2)^{th}$ face 622. The $(1\text{-}1)^{th}$ face 611 of the first circuit board 610 and the $(2\text{-}2)^{th}$ face 622 of the second circuit board 620 may be disposed to face each other, and may provide an inner space (e.g., the inner space 675 of FIG. 7A) shielded from the outside, along with the shield can 670 and/or the adhesive member 680.

According to various embodiments, at least one electronic component of the first circuit board 610 and at least one electronic component of the second circuit board 620 disposed in the interior space 675 may be stacked on top of each other. For example, the first communication module 630 disposed on the $(1-1)^{th}$ face 611 of the first circuit board 610 and the second communication module 640 disposed on the $(2-2)^{th}$ face 622 of the second circuit board 620 may be disposed to at least partially face each other and to be spaced apart by a designated interval. As another example, the first connector disposed on the $(1-1)^{th}$ face 611 of the first circuit board 610 may be disposed to be in contact with the second connector disposed on the $(2-2)^{th}$ face 622 of the second circuit board 620 so as to be electrically connected to the $(2-2)^{th}$ face 622 of the second circuit board 620.

According to various embodiments, in order to ensure mounting efficiency of electronic components, the first circuit board 610 may include one or more electronic components 612 on the $(1-2)^{th}$ face 612 thereof in addition to the $(1-1)^{th}$ face 611 thereof, and may be covered with a shield can 670 so as to be shielded from the outside.

According to various embodiments, the $(2-1)^{th}$ face 621 of the second circuit board 620 may include multiple radiation conductors 690. The multiple radiation conductors 690 may include an array of multiple conductive plates. For example, each of the conductive plates may have a structure including a metal material, and may be provided as a radiator of an antenna. According to an embodiment, if the second circuit board 620 is implemented as a multilayer circuit board, a part of a conductive layer (or a wiring layer) may be used inside the second circuit board 620 to provide patch-type or dipole type conductive plates or dipole-type conductive plates. Although not illustrated, the second circuit board 620 may be formed of a multilayer circuit board structure may include conductive plates having a grid structure formed by a combination of via pads of each conductive layer and via holes formed in an insulating layer between conductive layers. The conductive plates having a grid structure may form another antenna array on a side face of the second circuit board 620 or inside the second circuit board 620 adjacent to the side face. For example, various types of radiation conductors or antenna arrays may be formed on one face and the other face of the second circuit board 620 or inside the second circuit board 620.

According to various embodiments, the adhesive member 680 may be disposed between the shield can 670 and the second circuit board 620. The adhesive member 680 may include a conductive material, and may be provided in a shape corresponding to one face of the shield can 670. For example, the adhesive member 680 may include multiple openings 673 corresponding to various electronic components mounted on the first circuit board 610 and/or the second circuit board 620. An opening of the adhesive member 680 may be formed to have a size corresponding to the size of the first communication module 630 so as to allow the first communication module 630 to pass therethrough and to enclose the peripheral edge area of the first communication module 630. As another example, other openings of the adhesive member 680 may be formed to have sizes which respectively correspond to the sizes of the second communication module 640 and the connectors 650 and 660, so as to allow the second communication module 640 and the connectors 650 and 660 to pass through the openings, respectively, and to enclose the peripheral edge areas of the second communication module 640 and the connectors 650 and 660.

According to various embodiments, the adhesive member 680 may include a conductive film as an adhesive material. The conductive film may include an anisotropic conductive film. For example, the adhesive member 680 may be used to bond the shield can 670 formed as a separate structure to the second circuit board 620. The adhesive member 680 may bond the shield can 670 to the $(2-2)^{th}$ face 622 of the second circuit board 620 and then provide heat so as to provide the energization between a ground and conductive vias.

Figure 11:
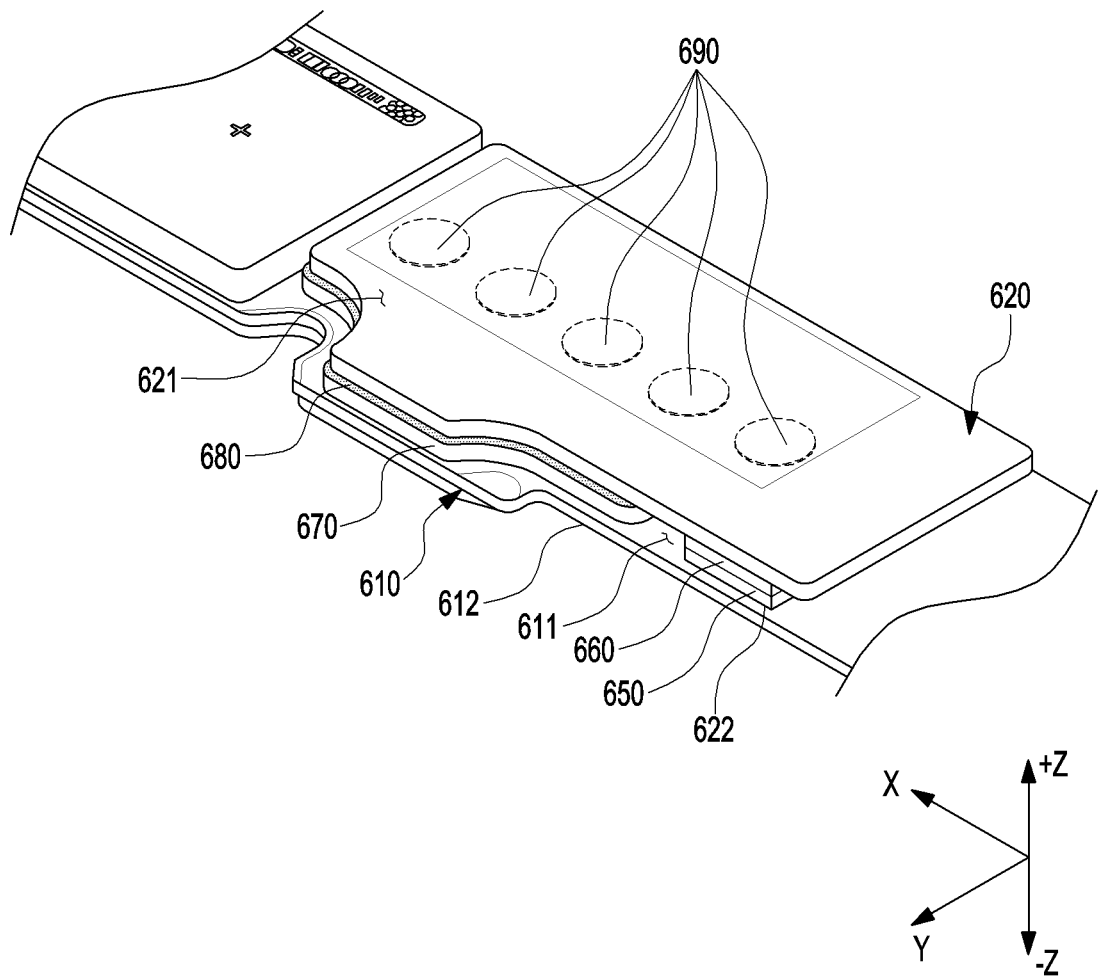
FIG. 11 is a perspective view illustrating an example stacked circuit board structure according to another embodiment.

FIG. 11 is a perspective view illustrating an example stacked circuit board structure according to another embodiment.

Referring to FIG. 11, an electronic device (e.g., the electronic device 101 in FIGS. 1 to 5) may include a first circuit board 610, a second circuit board 620 stacked on at least a partial area of the first circuit board 610, a shield can 670 disposed between the first circuit board 610 and the second circuit board 620, and a conductive adhesive member 680, at least a part of which is disposed between the second circuit board 620 and the shield can 670. The structures of the first circuit board 610, the second circuit board 620, the shield can 670, and the conductive adhesive member 680 in FIG. 11 may be the same as or similar to all or part of the structures of the first circuit board 610, the second circuit board 620, the shield can 670, and the conductive adhesive member 680 in FIGS. 7A, 7B, 8, 9 and 10. Hereinafter, the structures different from those of FIG. 8 will be described, and the descriptions of the other structures in FIGS. 8, 9 and 10 are applicable to the other structures.

According to various embodiments, the first circuit board 610 may include multiple electronic components and the first connector 650 disposed to be oriented in the first direction (+Z). Some of the electronic components may be disposed in the inner space formed by the first circuit board 610, the second circuit board 620, and the shield can 670, and the first connector 650 may be disposed outside the inner space. For example, the first connector 650 may be electrically connected to the electronic components (e.g., the first communication module) mounted on the first circuit board 610, and may be disposed in the space outside the shield can 670.

According to various embodiments, the second circuit board 620 may include multiple electronic components and the second connector 660 disposed to be oriented in the second direction (−Z). Some of the electronic components may be disposed in the inner space formed by the second circuit board 620, the first circuit board 610, and the shield can 670, and the first connector 660 may be disposed outside the inner space. For example, the second connector 660 may be electrically connected to the electronic components (e.g., the second communication module) mounted on the second circuit board 620, and may be disposed in the outer space of the shield can 670.

According to various embodiments, the first connector 650 on the first circuit board 610 may be disposed to face the second connector 660 on the second circuit board 620, and may be electrically connected to the second connector 660. By the connection between the first connector 650 and the second connector 660, a control signal, power, or a communication signal may be transmitted from the first circuit board 610 to the second circuit board 620. As another example, by the connection between the first connector 650 and the second connector 660, a control signal, power, and/or a communication signal may be transmitted from the second circuit board 620 to the first circuit board 610. The connection structure between the connectors is formed in the outer space of the shield can 670, but is not limited thereto. A separate connector structure may also form a separate connector in the inner space in addition to the outer area of the shield can, thereby providing electrical connection between the circuit boards.

Figure 12:
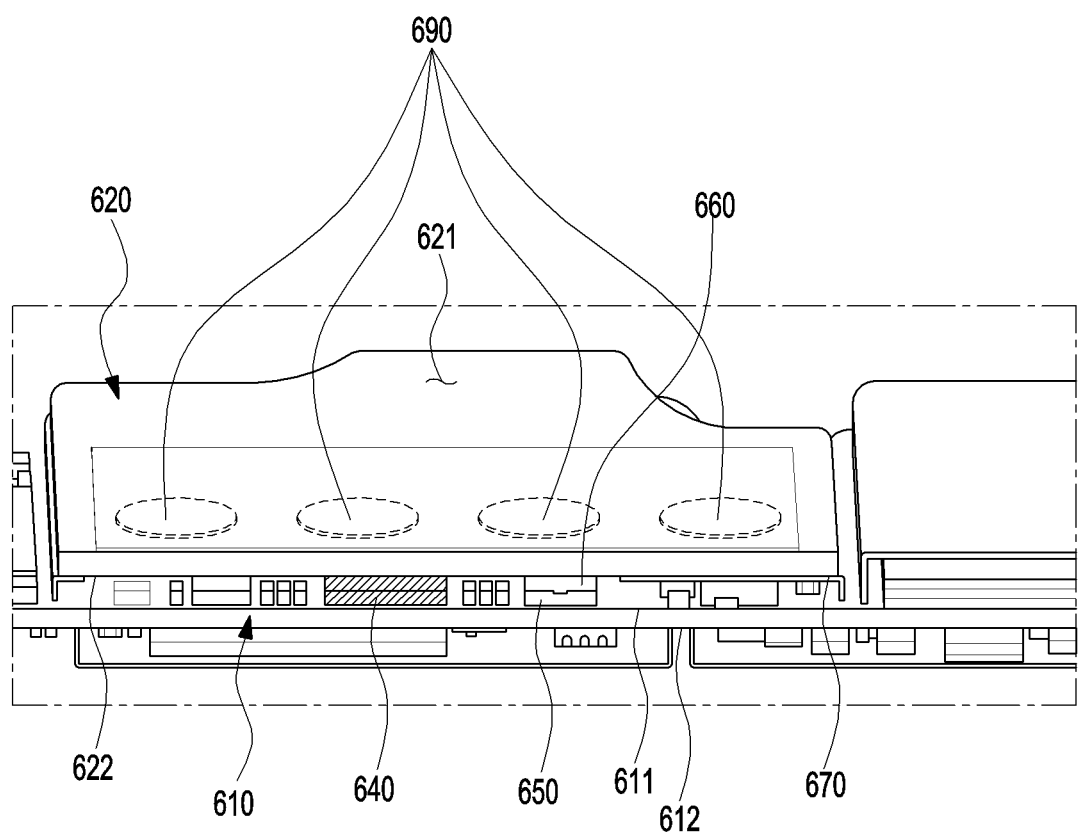
FIG. 12 is a cross-sectional view of the stacked circuit board structure of FIG. 8 according to various embodiments, which is taken along line A-A'.
Figure 13:
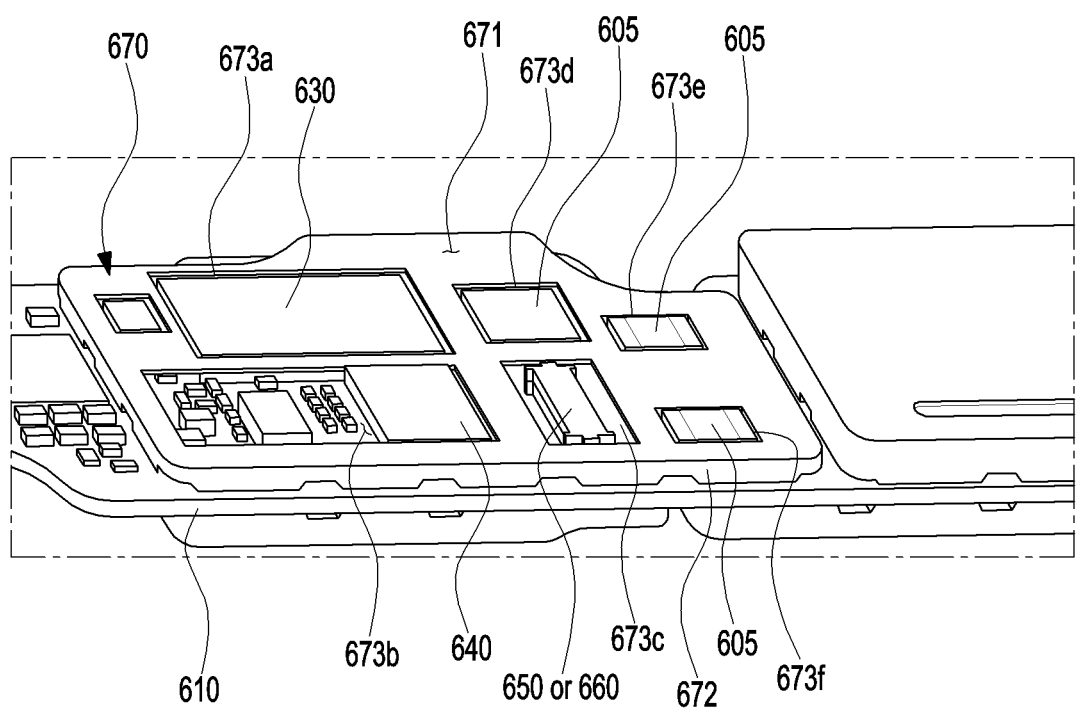
FIG. 13 is a perspective view illustrating an example stacked circuit board structure in which a second circuit board is omitted according to various embodiments.

FIG. 12 is a cross-sectional view illustrating the stacked circuit board structure of FIG. 8 taken along line A-A' according to various embodiments. FIG. 13 is a perspective view illustrating an example stacked circuit board structure according to various embodiments, in which a second circuit board is omitted.

Referring to FIGS. 12 and 13, an electronic device may include a first circuit board 610, a second circuit board 620 stacked on at least a partial area of the first circuit board 610, a first communication module 630 disposed on the first circuit board 610, a second communication module 640 disposed on the second circuit board 620, a shield can 670 disposed between the first circuit board 610 and the second circuit board 620, and a conductive adhesive member (e.g., the conductive adhesive member 680 in FIG. 10) at least a part of which is disposed between the second circuit board 620 and the shield can 670. The structures of the first circuit board 610, the second circuit board 620, the first communication module 630, the second communication module 640, and the shield can 670 in FIGS. 12 and 13 may be the same as or similar to all or part of the structures of the first circuit board 610, the second circuit board 620, the first communication module 630, the second communication module 640, and the shield can 670 in FIGS. 7A, 7B, 8, 9 and 10.

According to various embodiments, the first communication module 630 may be mounted in an area on one side of the $(1\text{-}1)^{th}$ face 611 disposed to be oriented in the first direction (+Z) of the first circuit board 610, and the shield can 670 may be disposed to cover at least a part of the side faces of the first communication module 630. For example, the first communication module 630 may be disposed so as to correspond to a first opening 673a among the multiple openings formed in the upper face 671 of the shield can 670. The first communication module 630 may be configured to perform communication using a first designated frequency band among multiple designated frequency bands corresponding to a designated communication method, and the first designated frequency may be in the range of about 6 GHz to 300 GHz. The first communication module 630 may be electrically connected to the first connector 650 mounted on the $(1\text{-}1)^{th}$ face 611 of the first circuit board 610.

According to various embodiments, the second communication module 640 may be mounted in an area on one side of the $(2\text{-}2)^{th}$ face 622 disposed to be oriented in the second direction (−Z) of the first circuit board 610, and the shield can 670 may be disposed to cover at least a part of the side faces of the second communication module 640. For example, the second communication module 640 may be disposed so as to correspond to a second opening 673b among the multiple openings formed in the upper face 671 of the shield can 670. The second communication module 640 may be configured to perform communication using a second designated frequency band among multiple designated frequency bands corresponding to a designated communication method, and the second designated frequency may be in the range of about 6 GHz to 300 GHz. The second communication module 640 may be electrically connected to the second connector 660 mounted on the $(2\text{-}2)^{th}$ face 622 of the second circuit board 620.

According to various embodiments, the first communication module 630 may be disposed to be parallel to the second communication module 640. For example, at least a portion of the first communication module 630 and at least a portion of the second communication module 640 correspond to each other (e.g., overlapping or parallel to each other) when viewed from a side face of the stacked circuit board structure. The first communication module 630 and the second communication module 640 may be set to have a thickness equal to or larger than half the thickness of the side face of the shield can 670, and may be disposed to be spaced away from a separate area of the shield can 670 (e.g., an area corresponding to the first opening 673a or the second opening 673b). However, the arrangement of the first communication module 630 and the second communication module 640 is not limited to this, and in correspondence to a design change in the thickness of the shield can 670, the first communication module 630 and the second communication module 640 may be stacked one on another such that the area oriented in the first direction of the first communication module 630 and the area oriented in the second direction (−Z) of the second communication module 640 face each other.

According to various embodiments, the first connector 650 and the second connector 660 may be in contact with each other to provide an electrical flow between the first circuit board 610 and the second circuit board 620. For example, each of the first connector 650 and the second connector 660 may be mounted on one of the first circuit board 610 and the second circuit board 620 to correspond to a third opening 673c among the multiple openings formed in the upper face 671 of the shield can 670.

According to various embodiments, the shield can 670 may be disposed between the first circuit board 610 and the second circuit board 620 so as to shield the electronic components mounted on the first circuit board 610 and the second circuit board 620. For the shielding, an adhesive member 680 may be disposed on the upper face 671 of the shield can 670 so as to bond the upper face 671 of the shield can 670 to the $(2\text{-}2)^{th}$ face 622 of the second circuit board 620. As another example, the side face 672 of the shield can 670 may be electrically connected to a ground formed on one face of the first circuit board 610, and the adhesive member 680 may include a conductive film and may be connected to a ground portion (to form a ground), which is formed on one face of the second circuit board 620 through the conductive film.

According to various embodiments, lumped or plural elements 605, such as, for example, and without limitation, a resistive element, an inductive element, and/or a capacitive element, or the like, may be mounted on the first circuit board 610 and/or the second circuit board 620. Each of the lumped elements 605 may be mounted on the first circuit board 610 and/or the second circuit board 620 to correspond to one of a fourth opening 673d, a fifth opening 673e, and a sixth opening 673f among the multiple openings formed in the upper face 671 of the shield can 670. At least some of the lumped elements 605 have a thickness of half or more of the thickness of the side face of the shield can 670. Thus, the at least some of the lumped elements 605 are not stacked on other lumped elements, and may be disposed in a separate area of the shield can 670 to be spaced apart from the other lumped elements.

According to various embodiments, the multiple radiation conductors (e.g., an array of conductive plates) 690 may be disposed to face at least a portion of the second communication module 640 across the second circuit board 620. According to an embodiment, the multiple radiation conductors 690 may be implemented in various shapes such as, for example, and without limitation, a rod, a meander line, a patch, and a microstrip, or the like. In addition, the multiple radiation conductors 690 may be electrically connected to a feeding unit so as to transmit and receive an RF signal in at least one frequency band. For example, the feeding unit 101 may be electrically connected to the multiple radiation conductors 690 and may apply signal current to the radiation conductors 690 so as to supply an RF signal, or may receive another RF signal through the radiation conductors. According to an embodiment, the second circuit board 620 may further include another conductive plate (not illustrated) provided therein. The conductive plates may be electrically connected to the second communication module 640 through a wiring path formed inside the second circuit board 620 so as to transmit and receive radio waves.

According to various embodiments, the second communication module 640 (e.g., an RF communication circuit) is electrically connected to an array of multiple radiation conductors 690, and may perform RF communication using the array of radiation conductors 690 under the control of a processor (e.g., the processor 240 in FIG. 2 or the processor 440 in FIG. 5).

According to various embodiments, the first communication module 630 and/or the second communication module 640 may transmit and/or receive a signal having a frequency in the range of about 6 GHz to 300 GHz. For example, if the electronic device supports a single frequency band, the first communication module 630 and/or the second communication module 640, which are electrically connected to the antenna array, may be implemented as a communication device of a frequency band corresponding thereto. As another example, if the electronic device supports dual frequency bands (e.g., a frequency band of about 28 GHz and a frequency of about 39 GHz), the first communication module 630 and/or the second communication module 640 may be implemented as a communication device of dual frequency bands corresponding thereto. For example, a part of the first communication module 630 and/or the second communication module 640 may be implemented as a communication device of a $(1-1)^{th}$ frequency band (e.g., an about 28 GHz frequency band), and the remaining part may be implemented as a communication device of a $(1-2)^{th}$ frequency band (e.g., an about 39 GHz frequency band).

According to various embodiments, the first communication module 630 and/or the second communication module 640 (e.g., an integrated circuit chip) may be mounted on the first circuit board 610 and/or the second circuit board 620 in, for example, and without limitation, a ball grid array (BGA) manner, a land grid array (LGA) manner, or the like.

Figure 14:
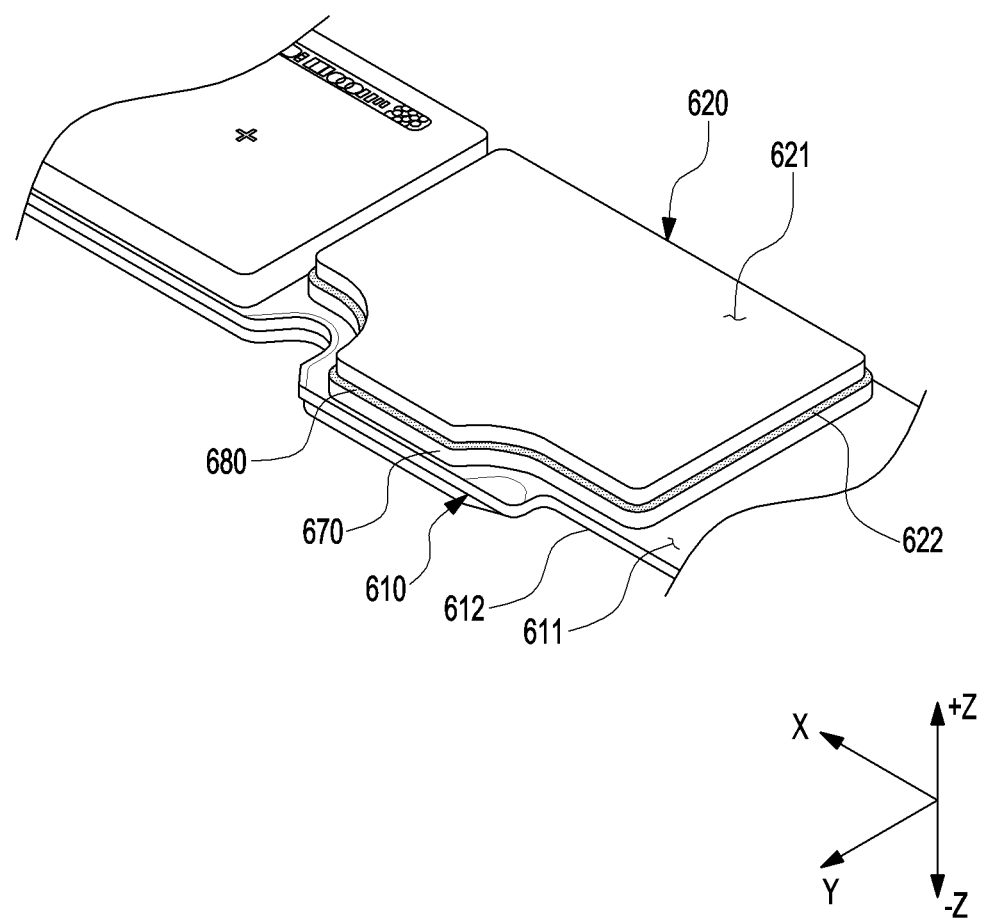
FIG. 14 is a perspective view illustrating an example stacked circuit board structure according to another embodiment of the disclosure.
Figure 15:
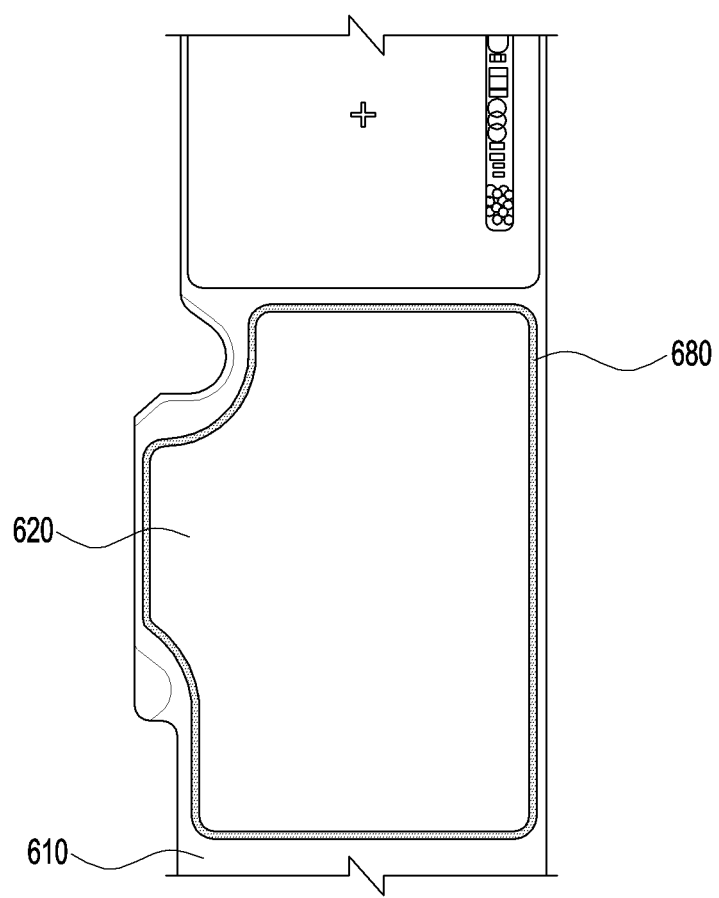
FIG. 15 is a top view illustrating an example array of radiation conductors, in which an array of radiation conductors are disposed on a face of a circuit board according to another embodiment of the disclosure.
Figure 16:
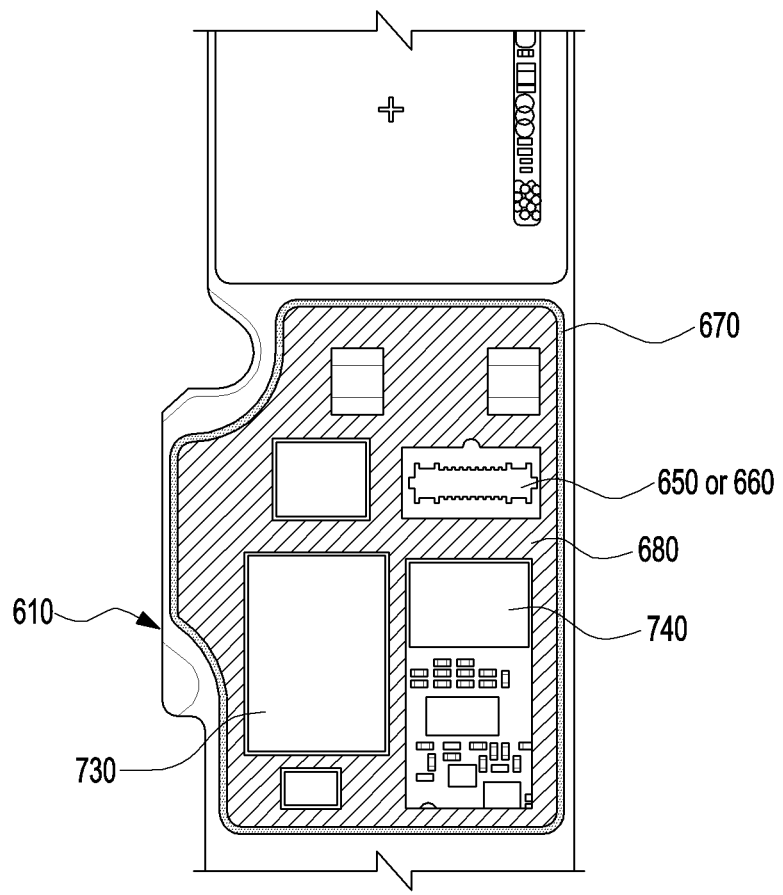
FIG. 16 is a diagram illustrating an example adhesive member and electronic components located in a stacked circuit board structure according to another embodiment of the disclosure.
Figure 17:
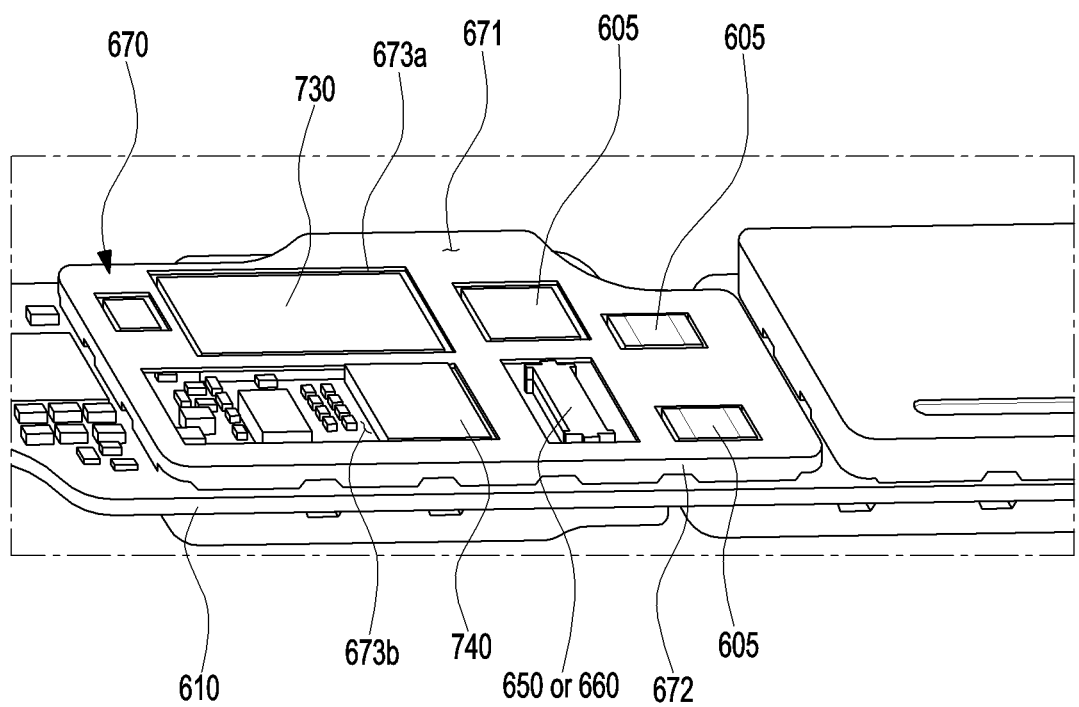
FIG. 17 is a perspective view illustrating an example stacked circuit board structure in which a second circuit board is omitted according to another embodiment of the disclosure.

FIG. 14 is a perspective view illustrating an example stacked circuit board structure according to another embodiment of the disclosure. FIG. 15 is a top view of an array of radiation conductors, in which an array of radiation conductors disposed on a face of a circuit board according to another embodiment of the disclosure is illustrated. FIG. 16 is a diagram illustrating an example adhesive member and electronic components located in a stacked circuit board structure according to another embodiment of the disclosure. FIG. 17 is a perspective view illustrating a stacked circuit board structure according to another embodiment of the disclosure, in which a second circuit board is omitted.

Referring to FIGS. 14, 15, 16 and 17, an electronic device (e.g., the electronic device 101 in FIGS. 1 to 5) may include a first circuit board 610, a second circuit board 620 stacked on at least a partial area of the first circuit board 610, a first circuit component 730 disposed on the first circuit board 610, a second circuit component 740 disposed on the second circuit board 620, a shield can 670 disposed between the first circuit board 610 and the second circuit board 620, and a conductive adhesive member 680, at least a part of which is disposed between the second circuit board 620 and the shield can 670. The structures of the first circuit board 610, the second circuit board 620, the shield can 670, and the conductive adhesive member 680 in FIGS. 14, 15, 16 and 17 may be the same as or similar to all or part of the structures of the first circuit board 610, the second circuit board 620, the shield can 670, and the conductive adhesive member 680 in FIGS. 7A, 7B, 8, 9, 10, 11, 12 and 13.

Hereinafter, the structures different from those of FIGS. 7A, 7B, 8, 9, 10, 11, 12 and 13 will be described, and the descriptions of the configurations of FIGS. 7A, 7B, 8, 9, 10, 11, 12 and 13 are applicable to the other configurations. Referring to FIGS. 14, 15, 16 and 17, circuit components disposed on a circuit board will be described.

According to various embodiments, the first circuit board 610 and the second circuit board 620 may be disposed to be spaced apart from each other and to face each other. For example, at least a partial area of the first circuit board 610 and at least a partial area of the second circuit board 620 may be stacked to overlap each other when viewed from above the stacked circuit boards. According to an embodiment, the first circuit board 610 may include a $(1-1)^{th}$ face 611 oriented in the first direction (+Z) and a $(1-2)^{th}$ face 612 oriented in the second direction (-Z), which is opposite the first direction (+Z). Various electronic components including the first circuit component 730 may be mounted on the $(1-1)^{th}$ face 611 and/or the $(1-2)^{th}$ face 612. For example, the first circuit component 730 may be a transceiver. The transceiver may transmit and receive an analog signal or a digital signal under a control of a processor. The second circuit board 620 may include a $(2-1)^{th}$ face 621 oriented in the first direction (+Z) and a $(2-2)^{th}$ face 622 oriented in the second direction (-Z). Various electronic components including the second circuit component 740 may be mounted on the $(2-1)^{th}$ face 621 and/or the $(2-2)^{th}$ face 622. For example, the second circuit component 740 may be a power amplifier module (PAM). As another example, the second circuit component 740 may be a low-band PAM. The $(1-1)^{th}$ face 611 of the first circuit board 610 and the $(2-2)^{th}$ face 622 of the second circuit board 620 may be disposed to face each other, and may provide an inner space shielded from the outside, along with the shield can 670 and/or the adhesive member 680.

According to various embodiments, the first circuit component 730 of the first circuit board 610 and the second circuit component 740 of the second circuit board 620 disposed in the inner space 675 may be stacked one on another. For example, the first circuit component 730 disposed on the $(1-1)^{th}$ face 611 of the first circuit board 610 and the second circuit component 740 disposed on the $(2-2)^{th}$ face 622 of the second circuit board 620 may be disposed to at least partially face each other and to be spaced apart by a designated interval.

According to various embodiments, the first circuit component 730 and the second circuit component 740 may be disposed in the inner space to be parallel to each other. For example, at least a portion of the first circuit component 730 and at least a portion of the second circuit component 740 may be disposed to overlap each other when viewed from a side face of the stacked circuit board structure. The first circuit component 730 and the second circuit component 740 may be set to have a thickness equal to or larger than half the thickness of the side face of the shield can 670, and may be disposed to be spaced away from a separate area of the shield can 670 (e.g., an area corresponding to the first opening 673a or the second opening 673b).

According to various embodiments, in order to ensure mounting efficiency of electronic components, the first circuit board 610 may include one or more electronic components on the $(1-2)^{th}$ face 612 thereof in addition to the $(1-1)^{th}$ face 611 thereof, and may be covered with a shield can 670 and the adhesive member 680 so as to be shielded from the outside. The adhesive member 680 may be disposed between the shield can 670 and the second circuit board 620. The adhesive member 680 may include a conductive material, and may be provided in a shape corresponding to one face of the shield can 670.

According to various embodiments, the adhesive member 680 may include a conductive film as an adhesive material. The conductive film may include an anisotropic conductive film. For example, the adhesive member 680 may be used to bond the shield can 670 formed as a separate structure to the second circuit board 620. The adhesive member 680 may bond the shield can 670 to the $(2\text{-}2)^{th}$ face 622 of the second circuit board 620 and then provide heat so as to provide the energization between a ground and conductive vias.

An electronic device (e.g., the electronic device 101 in FIGS. 1 to 5) according to various embodiments may include: a first communication module comprising communication circuitry (e.g., the first communication module 630 in FIG. 7A) configured to process a communication signal in a first frequency band among multiple frequency bands corresponding to a designated communication method; a second communication module (e.g., the second communication module 640 in FIG. 7A) comprising communication circuitry configured to process a communication signal in a second frequency band among the multiple frequency bands; a first circuit board (e.g., the first circuit board 610 in FIG. 7A) on which the first communication module and a first connector (e.g., the first connector 650 in FIG. 7A) electrically connected to the first communication module are mounted; a shield can (e.g., the shield can 670 in FIG. 7A) including an upper face (e.g., the upper face 671 in FIG. 7A) including at least one opening (e.g., the opening 673 in FIG. 7A) and a side face (e.g., the side face 672 in FIG. 7A) surrounding the upper face, the shield can being disposed on the first circuit board to accommodate the first communication module in an inner space (e.g., the inner space 675 in FIG. 7A) defined by the upper face and the side face, the side face being electrically connected to a first ground portion (e.g., the first ground portion 619 in FIG. 7A) of the first circuit board; a second circuit board on which the second communication module and a second connector (e.g., the second connector 660 in FIG. 7A) electrically connected to the second communication module are mounted, the second circuit board disposed on the upper face of the shield can such that the second communication module corresponds to the first communication module and/or at least one component mounted on the first circuit board in the inner space through one corresponding opening among the at least one opening wherein the second connector is electrically coupled to the first connector; and an adhesive (e.g., the adhesive member 680 in FIG. 7A) disposed between the upper face and the second circuit board.

According to various embodiments, the first connector and the second connector may be disposed in the inner space defined by the shield can.

According to various embodiments, the first connector and the second connector may be disposed adjacent to the shield can.

According to various embodiments, the first connector and the second connector may be electrically connected to each other to provide a line that connects at least one of a power signal or a control signal or transmits the communication signal between the first circuit board and the second circuit board.

According to various embodiments, the adhesive member may include at least one opening based on a shape of the upper face of the shield can.

According to various embodiments, the adhesive member may include a conductive adhesive tape, and the conductive adhesive tape may electrically connect the upper face of the shield can to a second ground portion (e.g., the second ground portion 629 in FIG. 7A) of the second circuit board.

According to various embodiments, the adhesive member may include a conductive clip, one end of the conductive clip may be coupled to enclose at least a part of the side face of the shield can, and the other end of the conductive clip may be electrically connected to a second ground portion of the second circuit board.

According to various embodiments, the second circuit board may further include multiple conductors (e.g., the radiation conductor (s) 690 in FIG. 7A) arranged on the second circuit board in an array.

According to various embodiments, the multiple radiation conductors may be disposed on a face of the second circuit board opposite a face of the second circuit board on which the second communication module is mounted.

According to various embodiments, the first frequency band may have a range smaller than a range of the second frequency band.

According to various embodiments, the multiple radiation conductors may have a conductor size corresponding to a wavelength in a frequency band in a range of 6 GHz to 300 GHz included in the second frequency.

According to various embodiments, the electronic device may further include a processor mounted on the first circuit board, wherein the processor is configured to: provide a control signal to the first communication module to process a communication signal of the first frequency band and deliver the communication signal of the first frequency band to the second communication module; and provide a designated control signal to the second communication module to process a communication of the second designated frequency band.

According to various embodiments, the first circuit board and the second circuit board may be spaced apart from each other by a predetermined distance, and the second circuit board may be stacked on at least a part of the first circuit board.

According to various embodiments, the second communication module may be disposed to overlap at least a part of the first communication module and/or a part of at least one component mounted on the first circuit board.

According to various embodiments, the electronic device may further include a processor mounted on the first circuit board, an RF transceiver mounted on the first circuit board, and an RF communication circuit mounted on the first communication module or the second communication module. The RF communication circuit may be configured to receive a designated control signal from the processor and may receive a communication signal from the RF transceiver.

An electronic device according to various embodiments may include: at least one first circuit component (e.g., the first circuit component 730 in FIGS. 16 and 17); at least one second circuit component (e.g., the second circuit component 740 in FIGS. 16 and 17); a first circuit board on which the at least one first circuit component and a first connector electrically connected to the at least one first circuit component are mounted; a shield can including an upper face including at least one opening and a side face surrounding the upper face, the shield can being disposed on the first circuit board to accommodate the at least one first circuit component in an inner space defined by the upper face and the side face, the side face being electrically connected to a first ground portion of the first circuit board; a second circuit board on which the at least one second circuit component and a second connector electrically connected to the at least one second circuit component are mounted, the second circuit board being disposed on the upper face of the shield can wherein the at least one second circuit component is stacked on the at least one circuit component in the inner space through the at least one opening in a state in which the second connector is electrically coupled to the first connector; and a conductive adhesive disposed between the upper face of the shield can and the second ground portion of the second circuit board.

According to various embodiments, the first connector and the second connector may be disposed in the inner space defined by the shield can.

According to various embodiments, the adhesive member may include at least one opening based on a shape of the upper face of the shield can.

According to various embodiments, the adhesive member may include a conductive adhesive tape, and the conductive adhesive tape may electrically connect the upper face of the shield can to a second ground portion of the second circuit board.

An electronic device according to various embodiments may include: a housing (e.g., the housing 310 in FIGS. 2 and 3) including a first plate (e.g., the front plate 302 in FIGS. 2 and 3) oriented in a first direction, a second plate (e.g., the rear plate 311 in FIGS. 2 and 3) oriented in a second direction opposite the first direction, and a side face (e.g., the side bezel structure 318 in FIGS. 2 and 3) surrounding a space between the first plate and the second plate; a display (e.g., the display 301 in FIGS. 2 and 3) exposed through at least a part of the first plate; a first circuit board disposed in the space and including a first communication module comprising communication circuitry configured to process a communication signal of a first frequency band and a first connector electrically connected to the first communication module; a second circuit board disposed to face at least a partial area of the first circuit board and including a second communication module comprising communication circuitry configured to process a communication signal of a second frequency band and a second connector electrically connected to the second communication module; a shield can disposed between the first circuit board and the second circuit board and including at least one opening; and a conductive adhesive bonding the second circuit board and the shield can to each other. The second communication module may be disposed in an inner space defined by the shield can through the at least one opening to be stacked on the first communication module and/or at least one component mounted on the first circuit board, and the first connector and the second connector may be stacked to be electrically connected to each other.

It may be apparent to one skilled in the technical field to which the disclosure belongs that the above-mentioned electronic device according to various example embodiments is not limited by the above-mentioned illustrative embodiments and drawings, and may be variously substituted, modified, and changed within the technical scope of the disclosure.

What is claimed is:

1. An electronic device comprising:
   a first communication module comprising communication circuitry configured to process a communication signal in a first frequency band among multiple frequency bands corresponding to a specified communication method;
   a second communication module comprising communication circuitry configured to process a communication signal in a second frequency band among the multiple frequency bands;
   a first circuit board on which the first communication module and a first connector electrically connected to the first communication module are mounted;
   a shield can including an upper face including at least one opening, the shield can further including a side face surrounding the upper face, the shield can being disposed on the first circuit board to accommodate the first communication module in an inner space defined by the upper face and the side face, the side face being electrically connected to a first ground portion of the first circuit board;
   a second circuit board on which the second communication module and a second connector electrically connected to the second communication module are mounted, the second circuit board being disposed on the upper face of the shield can wherein the second communication module corresponds to the first communication module and/or at least one component mounted on the first circuit board in the inner space through a corresponding opening among the at least one opening where the second connector is electrically coupled to the first connector; and
   an adhesive disposed between the upper face and the second circuit board.

2. The electronic device of claim 1, wherein the first connector and the second connector are disposed in the inner space defined by the shield can.

3. The electronic device of claim 1, wherein the first connector and the second connector are disposed adjacent to the shield can.

4. The electronic device of claim 1, wherein the first connector and the second connector are electrically connected to each other to provide a line that connects at least one of a power signal, a control signal or transmits the communication signal between the first circuit board and the second circuit board.

5. The electronic device of claim 1, wherein the adhesive includes at least one opening based on a shape of the upper face of the shield can.

6. The electronic device of claim 1, wherein the adhesive comprises conductive adhesive tape, and the conductive adhesive tape is configured to electrically connect the upper face of the shield can to a second ground portion of the second circuit board.

7. The electronic device of claim 1, wherein the adhesive comprises a conductive clip, wherein one end of the conductive clip is coupled to enclose at least a part of the side face of the shield and another end of the conductive clip is electrically connected to a second ground portion of the second circuit board.

8. The electronic device of claim 1, wherein the second printed circuit board further includes multiple radiation conductors arranged in an array.

9. The electronic device of claim 8, wherein the multiple radiation conductors are disposed on a face of the second circuit board opposite a face of the second circuit board on which the second communication module is mounted.

10. The electronic device of claim 8, wherein the multiple radiation conductors have a conductor size corresponding to a wavelength in a frequency band in a range of 6 GHz to 300 GHz included in the second designated frequency.

11. The electronic device of claim 10, further comprising:
a processor mounted on the first circuit board,
wherein the processor is configured to:
provide a control signal to the first communication module to process a communication signal of the first frequency band and deliver the communication signal of the first frequency band to the second communication module; and
provide a control signal to the second communication module to process a communication signal of the second frequency band.

12. The electronic device of claim 1, wherein the second communication module is disposed to overlap at least a part of the first communication module and/or a part of at least one component mounted on the first circuit board.

13. The electronic device of claim 1, wherein the first frequency band has a range smaller than a range of the second frequency band.

14. The electronic device of claim 1, wherein the first circuit board and the second circuit board are spaced apart from each other by a predetermined distance, and
the second circuit board is stacked on at least a part of the first circuit board.

15. The electronic device of claim 14, further comprising:
a processor mounted on the first circuit board;
an RF transceiver mounted on the first circuit board; and
an RF communication circuit mounted on at least one of the first communication module or the second communication module,
wherein the RF communication circuit is configured to receive a designated control signal from the processor and to receive a communication signal from the RF transceiver.

16. An electronic device comprising:
at least one first circuit component;
at least one second circuit component;
a first circuit board on which the at least one first circuit component and a first connector electrically connected to the at least one circuit component are mounted;
a shield can including an upper face including at least one opening, the shield can further comprising a side face surrounding the upper face of the shield can, the shield can being disposed on the first circuit board to accommodate the at least one first circuit component in an inner space of the shield can defined by the upper face and the side face, the side face being electrically connected to a first ground portion of the first circuit board;
a second circuit board on which the at least one second circuit component and a second connector electrically connected to the at least one second circuit component are mounted, the second circuit board being disposed on the upper face of the shield can such that the at least one second circuit component is stacked on the at least one circuit component in the inner space through the at least one opening wherein the second connector is electrically coupled to the first connector; and
a conductive adhesive disposed between the upper face and the second circuit board.

17. The electronic device of claim 16, wherein the first connector and the second connector are disposed in the inner space defined by the shield can.

18. The electronic device of claim 16, wherein the adhesive includes at least one opening based on a shape of the upper face of the shield can.

19. The electronic device of claim 16, wherein the adhesive comprises a conductive adhesive tape, and the conductive adhesive tape electrically connects the upper face of the shield can to a second ground portion of the second circuit board.

20. An electronic device comprising:
a housing including a first plate oriented in a first direction, a second plate oriented in a second direction opposite the first direction, and a side face surrounding a space between the first plate and the second plate;
a display exposed through at least a part of the first plate;
a first circuit board disposed in the space and including a first communication module comprising communication circuitry configured to process a communication signal of a first frequency band and a first connector electrically connected to the first communication module;
a second circuit board disposed to face at least a partial area of the first circuit board and including a second communication module comprising communication circuitry configured to process a communication signal of a second frequency band and a second connector electrically connected to the second communication module;
a shield can disposed between the first circuit board and the second circuit board and including at least one opening; and
a conductive adhesive bonding the second circuit board and the shield can to each other,
wherein the second communication module is disposed in an inner space defined by the shield can through the at least one opening to be stacked on the first communication module and/or at least one component mounted on the first circuit board, and the first connector and the second connector are stacked to be electrically connected to each other.

* * * * *